(12) United States Patent
Stapleton et al.

(10) Patent No.: US 9,709,760 B2
(45) Date of Patent: Jul. 18, 2017

(54) CHIP ON FLEX OPTICAL SUBASSEMBLY

(71) Applicant: FINISAR CORPORATION, Sunnyvale, CA (US)

(72) Inventors: Brent Stapleton, Wylie, TX (US); Rajeev Dwivedi, Plano, TX (US); Harold Young Walker, Jr., Murphy, TX (US); Gary Landry, Allen, TX (US)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

(21) Appl. No.: 15/150,330

(22) Filed: May 9, 2016

(65) Prior Publication Data

US 2016/0341920 A1 Nov. 24, 2016

Related U.S. Application Data

(63) Continuation of application No. 13/715,738, filed on Dec. 14, 2012, now Pat. No. 9,337,932.

(Continued)

(51) Int. Cl.
*G02B 6/42* (2006.01)
*H04B 10/40* (2013.01)
(Continued)

(52) U.S. Cl.
CPC ......... *G02B 6/4246* (2013.01); *G02B 6/4257* (2013.01); *G02B 6/4263* (2013.01); *G02B 6/4269* (2013.01); *G02B 6/4281* (2013.01); *G02B 6/4283* (2013.01); *G02B 6/4286* (2013.01); *G02B 6/4292* (2013.01); *G02B 6/4295* (2013.01); *H01L 24/97* (2013.01); *H04B 10/40* (2013.01); *H04B 10/503* (2013.01); *H05K 13/046* (2013.01); *G02B 6/43* (2013.01); *H01L 2224/32145* (2013.01); *H01L 2224/45147* (2013.01); *H01L 2224/48091* (2013.01);
(Continued)

(58) Field of Classification Search
CPC ... G02B 6/42; G02B 6/43; G02B 6/36; G02B 6/428; G02B 6/4249; G02B 6/4239; G02B 6/26; G02B 6/4281; G02B 6/3897
See application file for complete search history.

(56) References Cited

U.S. PATENT DOCUMENTS 5,317,344 A * 5/1994 Beaman .................... B41J 2/45
346/139 R
7,604,419 B2 10/2009 Morioka
(Continued)

FOREIGN PATENT DOCUMENTS

| JP | 2004029621 A | 1/2004 |
|---|---|---|
| JP | 2007121920 A | 5/2007 |
| JP | 2011248210 A | 12/2011 |

*Primary Examiner* — Thomas A Hollweg
*Assistant Examiner* — Mary A El Shammaa
(74) *Attorney, Agent, or Firm* — Maschoff Brennan

(57) ABSTRACT

One example embodiment includes an optical subassembly (OSA). The OSA includes a flex circuit, an optical port, and an active optical component subassembly. The flex circuit is constructed of at least one electrically-conductive layer and at least one electrical insulator layer. The optical port defines a barrel cavity and is mechanically coupled to the flex circuit at a flex connection. The active optical component subassembly is positioned within the barrel cavity and electrically coupled to the flex circuit.

19 Claims, 17 Drawing Sheets

Related U.S. Application Data

(60) Provisional application No. 61/570,578, filed on Dec. 14, 2011.

(51) Int. Cl.
    *H04B 10/50*     (2013.01)
    *H05K 13/04*     (2006.01)
    *H01L 23/00*     (2006.01)
    *G02B 6/43*     (2006.01)

(52) U.S. Cl.
    CPC ............... *H01L 2224/48465* (2013.01); *H01L 2224/73265* (2013.01); *H01L 2924/12041* (2013.01); *H01L 2924/12042* (2013.01); *H01L 2924/12043* (2013.01); *Y10T 29/4913* (2015.01)

(56) References Cited

U.S. PATENT DOCUMENTS

2010/0172617 A1*   7/2010   Sato ........................ G02B 6/421
                                                                 385/88
2011/0052125 A1*   3/2011   Lee ........................ G02B 6/4246
                                                                  385/88

* cited by examiner

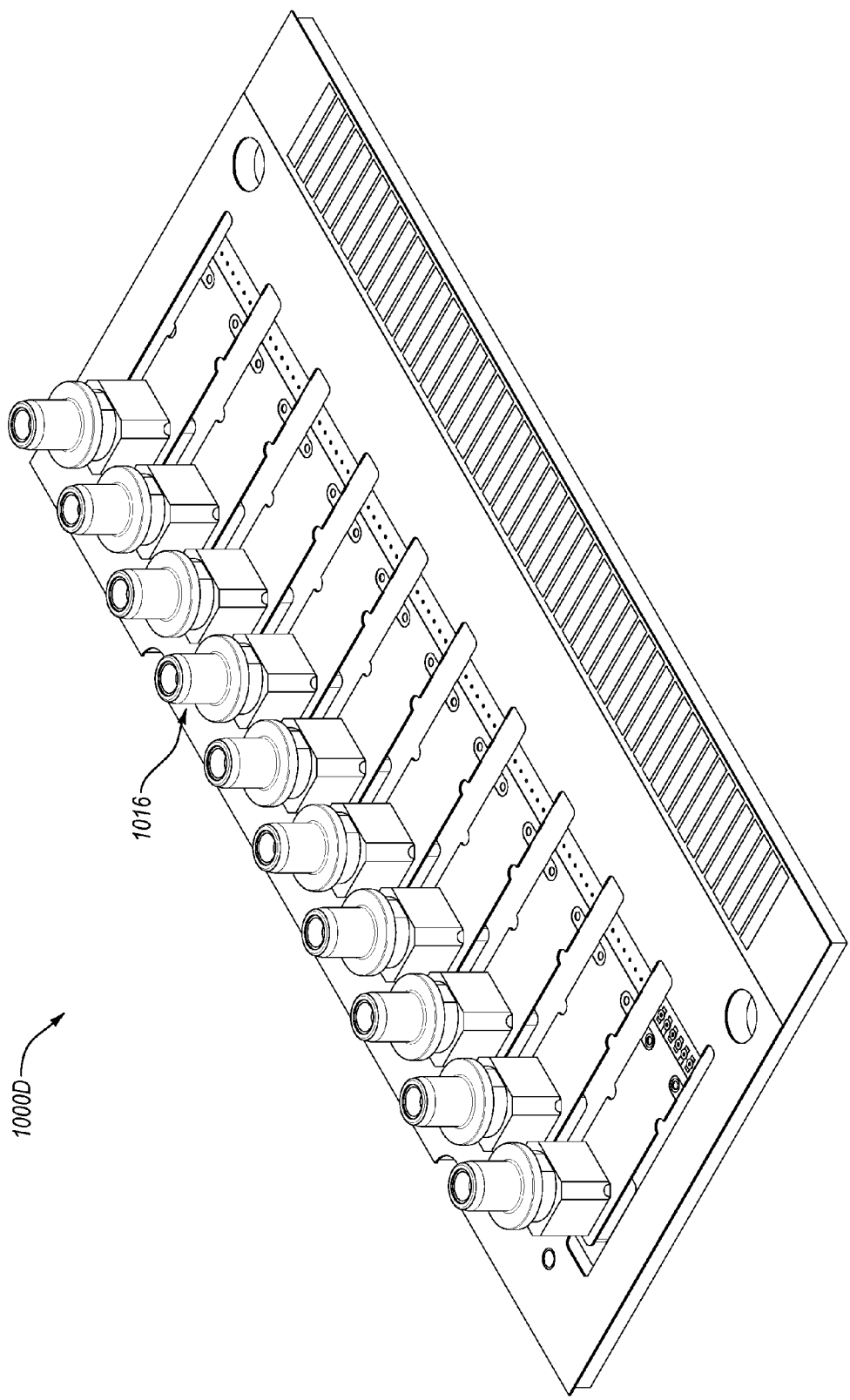

CHIP ON FLEX OPTICAL SUBASSEMBLY

CROSS-REFERENCE TO RELATED APPLICATIONS

This application is a continuation application of U.S. patent application Ser. No. 13/715,738 filed Dec. 14, 2012, which claims the benefit of and priority to U.S. Provisional Application 61/570,578 filed on Dec. 14, 2011, both of which are incorporated herein by reference in their entireties.

BACKGROUND

Field of the Invention

Embodiments described herein relate generally to optical subassemblies. More particularly, example embodiments relate to chip on flex optical subassemblies.

Related Technology

Communication modules, such as electronic or optoelectronic transceivers or transponder modules, are increasingly used in electronic and optoelectronic communication. Communication modules communicate with a host device printed circuit board (PCB) by transmitting and/or receiving electrical data signals to and/or from the host device PCB. The electrical data signals can also be transmitted by the communication module outside a host device as optical and/or electrical data signals. Many communication modules include optical subassemblies (OSAs) such as transmitter optical subassemblies (TOSAs) and/or receiver optical subassemblies (ROSAs) to convert between the electrical and optical domains.

Generally, a ROSA transforms an optical signal received from an optical fiber or another source to an electrical signal that is provided to the host device. A photodiode or similar optical receiver included in the ROSA transforms the optical signal to the electrical signal. A TOSA transforms an electrical signal received from the host device to an optical signal that is transmitted onto an optical fiber or other transmission medium. A laser diode or similar optical transmitter included in the TOSA is driven to emit the optical signal representing the electrical signal received from the host device.

A common configuration for OSAs includes a transistor outline ("TO") package such as a TO can. An example TO can is generally a self-contained and often hermetically sealed canister with one or more optical components disposed within the canister. Specifically, TO cans may incorporate one or more optical components such as an optical transmitter or an optical receiver. The TO can may be configured to fit within a cavity defined in an optical port opposite a second cavity configured to receive an optical fiber. The optical port enables the optical component(s) disposed within the TO can to communicate via the optical fiber. The TO can may further include electrical contacts that allow the optical component(s) to communicate with a host device electrically coupled to the OSA. However, the TO can increases the number of components required to produce an OSA, which increases manufacturing costs and may create electrical discontinuities.

The subject matter claimed herein is not limited to embodiments that solve any disadvantages or that operate only in environments such as those described above. Rather, this background is only provided to illustrate one exemplary technology area where some embodiments described herein may be practiced.

SUMMARY OF SOME SAMPLE EMBODIMENTS

This Summary is provided to introduce a selection of concepts in a simplified form that are further described below. This Summary is not intended to identify key features or essential characteristics of the claimed subject matter, nor is it intended to be used as an aid in determining the scope of the claimed subject matter.

One example embodiment includes an optical subassembly (OSA). The OSA includes a flex circuit, an optical port, and an active optical component subassembly. The flex circuit is constructed of at least one electrically-conductive layer and at least one electrical insulator layer. The optical port defines a barrel cavity and the optical port is mechanically coupled to the flex circuit at a flex connection. The active optical component subassembly is positioned within the barrel cavity and electrically coupled to the flex circuit.

Another example embodiment includes another OSA. The OSA includes an optical port, a flex circuit, a first active optical component subassembly optical subassembly, and a second active optical component subassembly. The optical port defines a barrel cavity having two barrel openings positioned on orthogonal sides of the optical port. The flex circuit includes a first portion that extends along a first of the two orthogonal sides to substantially cover a first of the two barrel openings. The flex circuit also includes a second portion that extends along the second of the two orthogonal sides to substantially cover a second of the two barrel openings. The first active optical component subassembly is electrically coupled to the first portion of the flex circuit such that the first active optical component assembly is positioned within the barrel cavity. The second active optical component subassembly is electrically coupled to the second portion of the flex circuit such that the second active optical component subassembly is positioned within the barrel cavity.

Another embodiment includes a method of constructing an array of COF OSAs. The method includes epoxying a top cover, a top metal, a core, a bottom metal, and a bottom cover to create an array of flex circuits. The method includes attaching heat sink stiffeners to each of the flex circuits in the array of flex circuits. The method includes electrically coupling active optical component subassemblies to each of the flex circuit in the array of flex circuits. The method also includes mounting optical ports to each of the flex circuit in the array of flex circuits such that each of the active optical component subassemblies are positioned within a barrel cavity defined by the optical ports.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIGS. 10A-10D illustrate an example construction process of an array of COF OSAs.

DETAILED DESCRIPTION OF SOME EXAMPLE EMBODIMENTS

Embodiments described herein relate generally to optical subassemblies (OSA). More particularly, some example embodiments relate to a chip on flex optical sub assembly (COF OSA) in which an active optical component and/or a housing containing the active optical component are mounted to a flex circuit. In some embodiments, the COF OSA includes an active optical component subassembly that includes an optical transmitter, a monitor photodiode ("monitor PD"), a spacer/heat dissipater, and a plate. In this embodiment, the optical transmitter, the monitor PD, and the spacer/heat dissipater are mounted to a flex circuit and may be disposed within a barrel cavity of an optical port. The plate may be fixed in the barrel cavity.

Alternately or additionally, a COF OSA may include a ROSA active optical component subassembly including a photodiode and an amplifier. In these and other embodiments, the amplifier and/or the photodiode may be mounted to a flex circuit and disposed within a barrel cavity of an optical port.

Some embodiments of the COF OSA described herein may include a lower part count than OSAs that include a TO can. Thus, construction of the COF OSA may include fewer steps than construction of OSAs with the TO can. Additionally or alternately, in some TO can OSAs, the port density may be limited by a diameter of the TO can. The COF OSA may enable a relatively smaller form factor (e.g., as die gets smaller, the pitch can increase) which in turn may enable higher port densities than OSAs that include the TO can.

Embodiments described herein may be implemented in optoelectronic devices. As used herein, the term "optoelectronic device" includes a device having both optical and electrical components. Examples of optoelectronic devices include, but are not limited to transponders, transceivers, transmitters, and/or receivers. While some embodiments described herein will be discussed in the context of a transceiver module, those of skill in the art will recognize that the principles of the present invention may be implemented in virtually any device having some or all of the functionality described below.

Figure 1A:
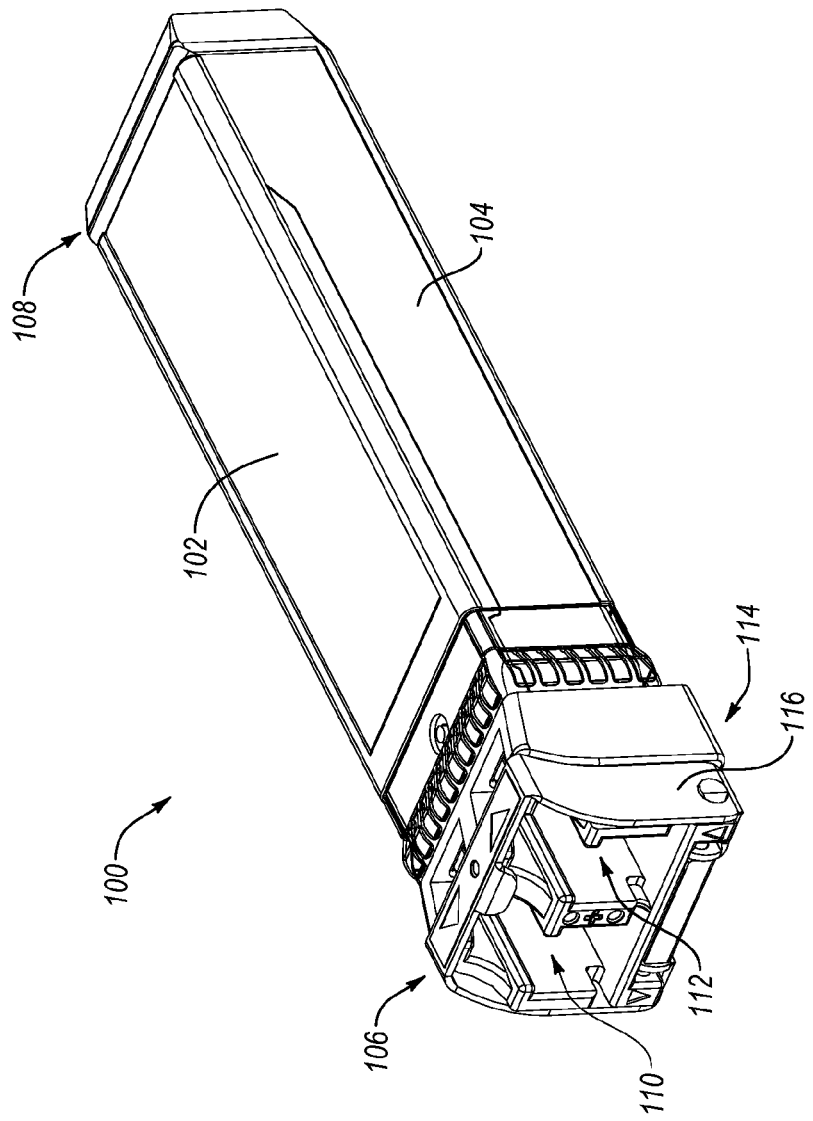
FIG. 1A illustrates a perspective view of an example transceiver in which an embodiments disclosed herein may be implemented.

FIG. 1A illustrates a perspective view of an example transceiver module generally designated as transceiver 100 in which a COF OSA may be implemented. The transceiver 100 can be an SFP+ optical transceiver in some embodiments. While described in some detail herein, the transceiver 100 is discussed by way of illustration only, and not by way of restricting the scope of the invention. For example, although the transceiver 100 can be an SFP+ optical transceiver in some embodiments, the principles of the invention can be implemented in optoelectronic modules of any form factor such as XFP, SFP, SFP+, SFF, XENPAK, and XPAK, without restriction. Alternatively or additionally, the transceiver 100 can be suitable for optical signal transmission and reception at a variety of per-second data rates, including but not limited to 1 gigabit per second (Gbit), 2 Gbit, 4 Gbit, 8 Gbit, 10 Gbit, 14 Gbit, 20 Gbit or other bandwidth fiber optic links. Furthermore, optoelectronic modules of other types and configurations, or having components that differ in some respects from those shown and described herein, can also benefit from the principles disclosed herein.

As shown in FIG. 1A, the transceiver 100 includes a body composed of a top shell 102 and a bottom shell 104. The bottom shell 104 defines a front end 106 and a back end 108 of the transceiver 100. Included on the front end 106 of the transceiver 100 are two fiber openings 110, 112 configured to receive connectors of an optical fiber (not shown). The two fiber openings 110, 112 include an output fiber opening 110 and an input fiber opening 112. The fiber openings 110, 112 define a portion of an interface portion 114 that is generally included on the front end 106 of the transceiver 100. The interface portion 114 can include structures to operably connect the transceiver 100 to optical fibers or optical fiber connectors such as, but not limited to, LC connectors.

Also disposed on the front end 106 of the transceiver 100 is a bail latch assembly 116 that enables the transceiver 100 to be removably secured in a host device (not shown). The body of the transceiver 100, including the top shell 102 and the bottom shell 104, can be formed of metal. Alternately or additionally, the host device may include a cage in which the transceiver 100 is inserted.

Figure 1B:
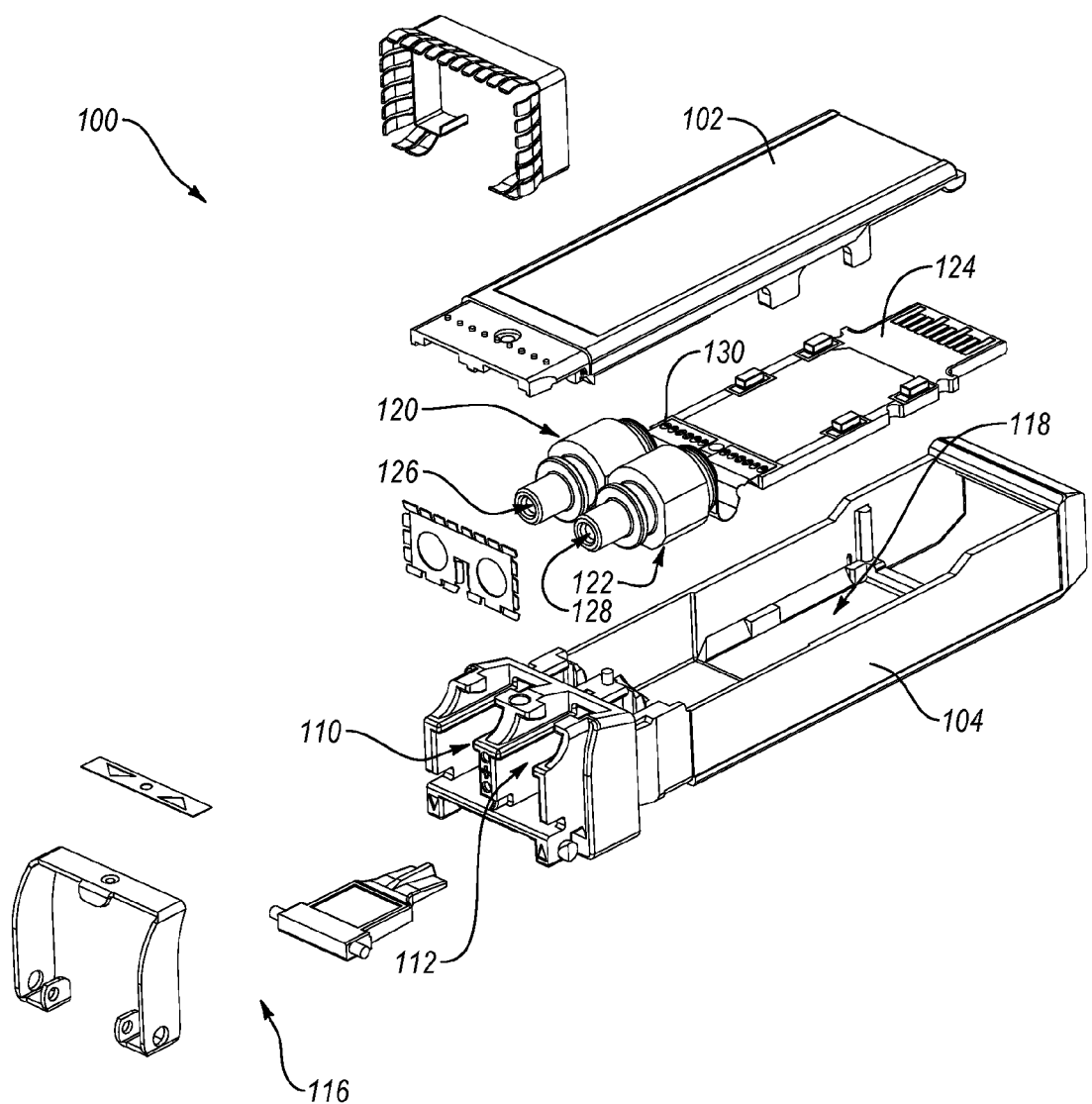
FIG. 1B illustrates an exploded perspective view of the transceiver of FIG. 1A.

FIG. 1B illustrates a partially exploded perspective view of the transceiver 100 of FIG. 1A. In FIG. 1B, the bottom shell 104 defines a cavity 118 in which a TOSA 120, a ROSA 122, a printed circuit board (PCB) 124, and PCB connectors 130 are included as internal components of the transceiver 100.

Each of the TOSA 120 and the ROSA 122 includes a fiber receiver 126 and 128, respectively, that extends into a respective one of the fiber openings 110, 112 so as to be positioned to mate with an optical fiber (not shown) or a connector portion (not shown) of the optical fiber when received within the fiber openings 110, 112. The TOSA 120 and the ROSA 122 can be electrically coupled to the PCB 124 via the PCB electric connectors 130. The PCB electric connectors 130 may include a lead frame connector or equivalent electrical contact(s) that allow the transmission of electrical signals between the PCB 124 and the TOSA 120 or ROSA 122.

During operation, the transceiver 100 can receive a data-carrying electrical signal from a host device, which can be any computing system capable of communicating with the transceiver 100, for transmission as a data-carrying optical signal on to an optical fiber (not shown). The electrical signal can be provided to an optical transmitter, such as a laser disposed within the TOSA 120, which converts the electrical signal into a data-carrying optical signal for emission on to an optical fiber and transmission via an optical communication network, for instance. The optical transmitter can include an edge-emitting laser diode, a Fabry-Perot ("FP") laser, a vertical cavity surface emitting laser ("VCSEL"), a distributed feedback ("DFB") laser, or other suitable light source. Accordingly, the TOSA 120 can serve or include components that serve as an electro-optic transducer.

In addition, the transceiver 100 can receive a data-carrying optical signal from an optical fiber via the ROSA 122. The ROSA 122 can include an optical receiver, such as a PIN photodiode, an avalanche photodiode ("APD"), or other suitable receiver, which transforms the received optical signal into a data-carrying electrical signal. Accordingly, the ROSA 122 can serve or include components that serve as an optoelectric transducer. The resulting electrical signal can then be provided to the host device in which the transceiver 100 is located.

Chip on Flex Optical Subassembly

Figure 2A:
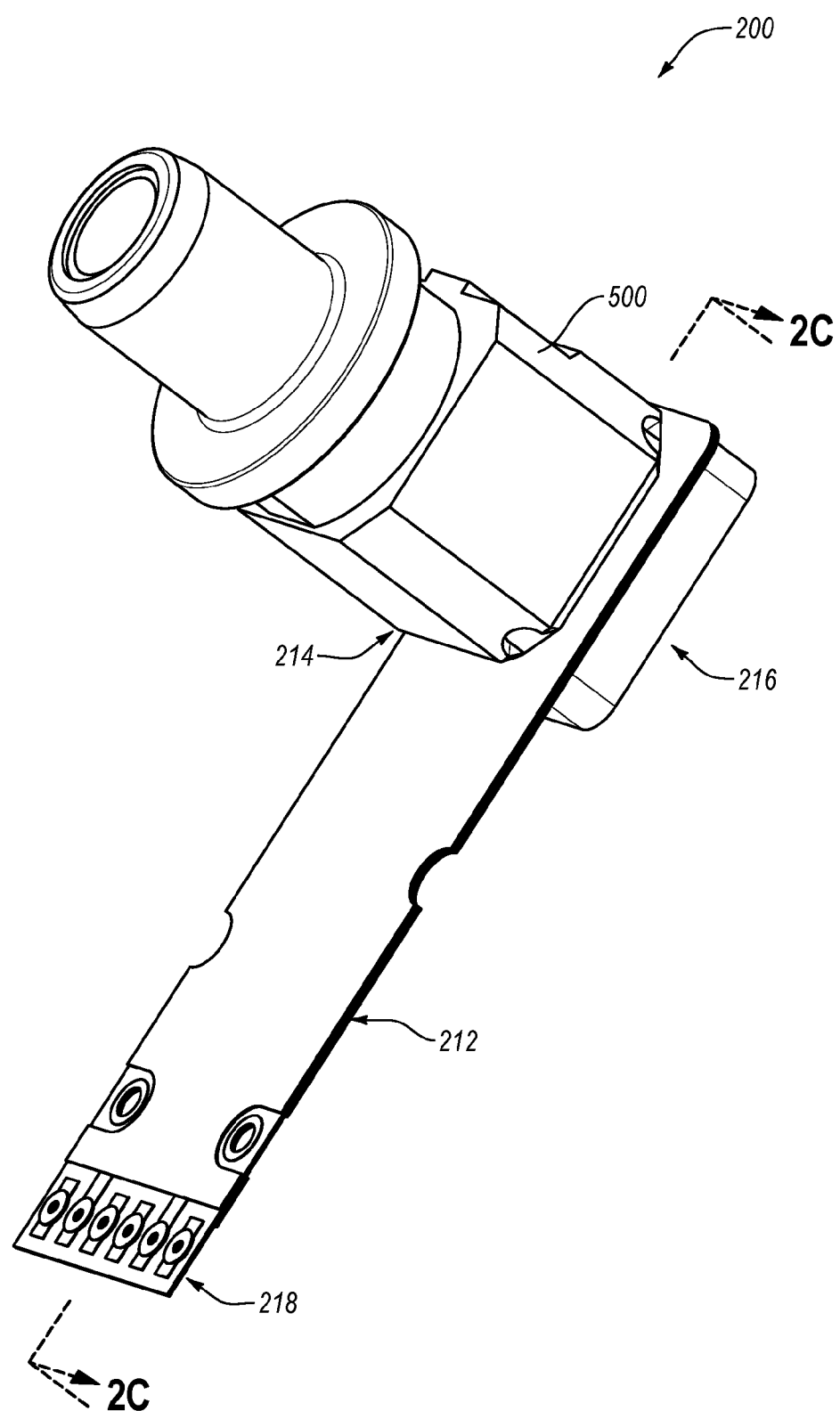
FIGS. 2A-2D illustrate an example chip on flex optical subassembly (COF OSA) that may be implemented in the transceiver of FIGS. 1A and 1B.
Figure 2B:
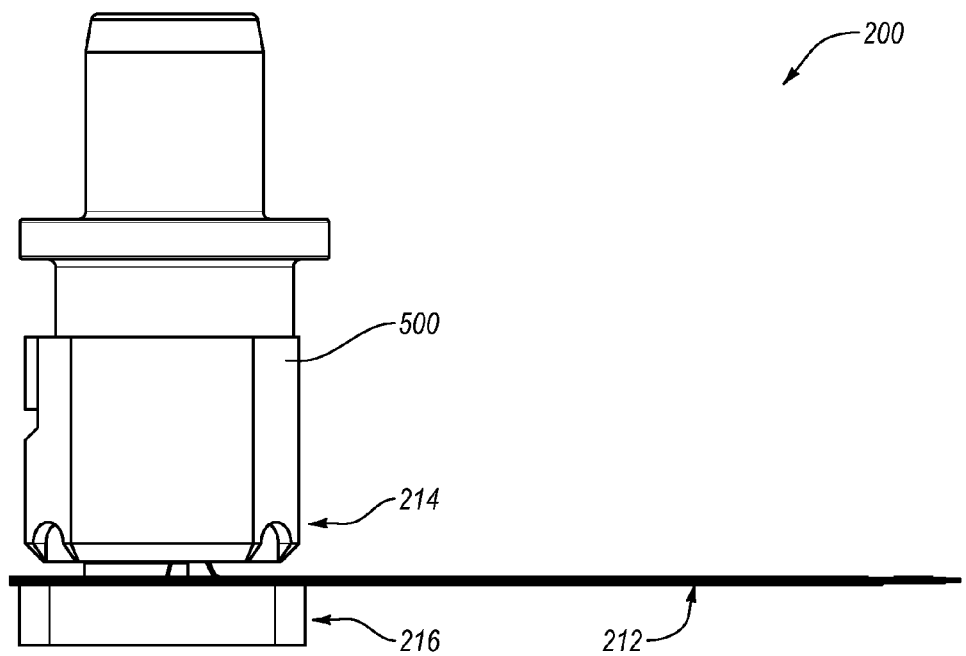
Figure 2C:
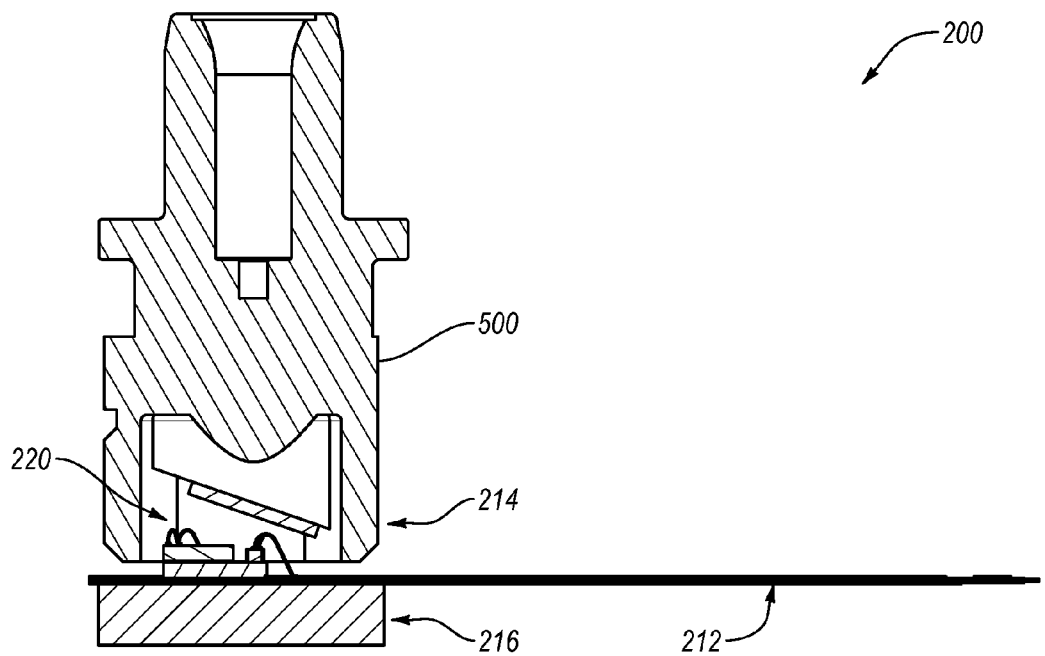
Figure 2D:
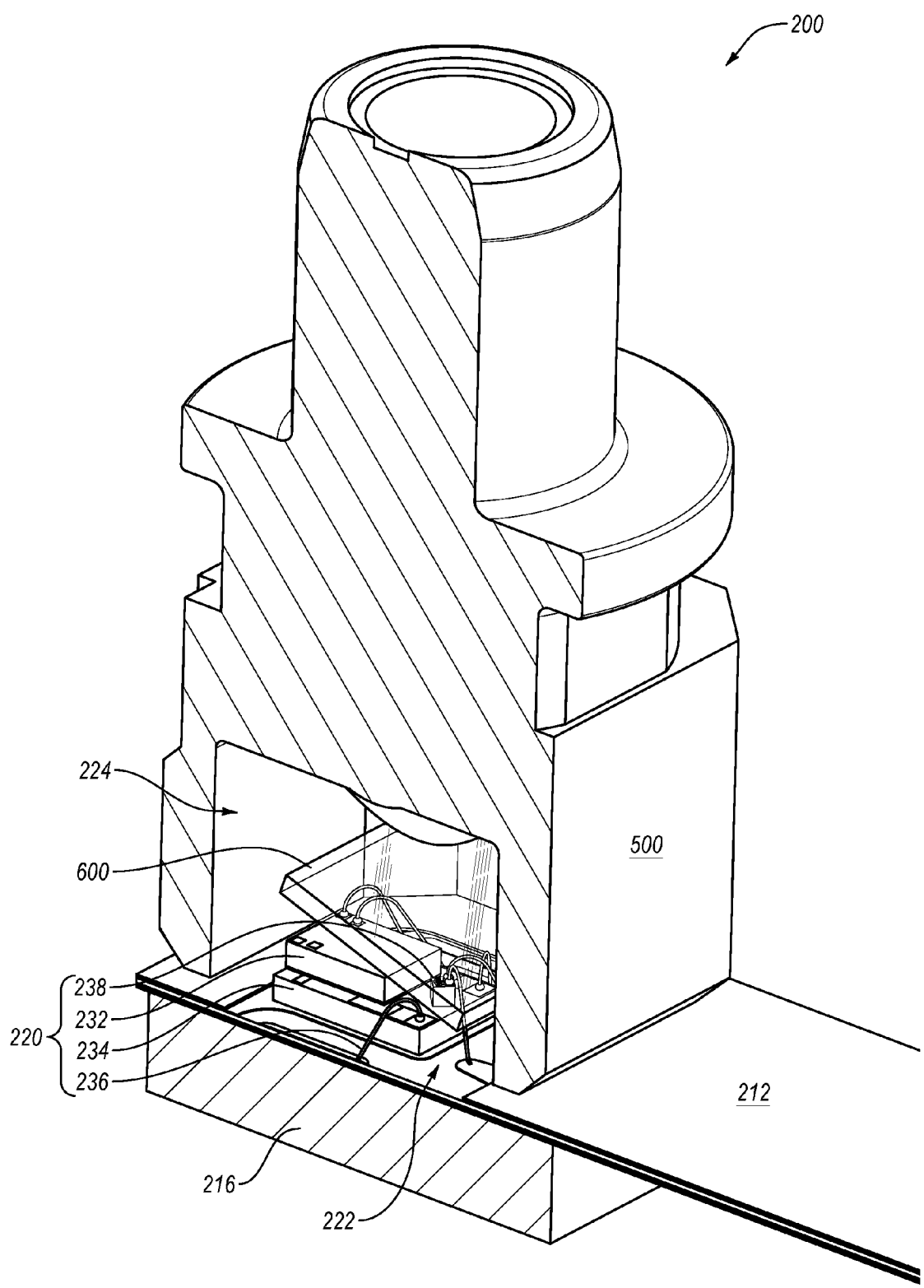

FIGS. 2A-2D illustrate an example COF OSA 200. Specifically, FIG. 2A illustrates an assembled, perspective view of the COF OSA 200; FIG. 2B illustrates an external side view of the COF OSA 200; FIG. 2C illustrates a cut-away side view of the COF OSA 200; and FIG. 2D illustrates a detailed cut-away perspective view of the COF OSA 200. The COF OSA 200 may generally correspond to the TOSA 120 or ROSA 122 described with reference to FIG. 1B, for instance.

With combined reference to FIGS. 2A-2D, the COF OSA 200 can include an optical port 500, a flex circuit 212, a heat sink stiffener 216, a PCB flex connection 218, an active optical component subassembly 220 (FIGS. 2C and 2D), and a flex connection 214 (FIG. 2A).

The COF OSA 200 is generally configured to covert electrical signals to optical signals and/or optical signals to electrical signals and to at least partially communicate the signals (i.e., electrical or optical signals) within an optoelectric system, such as the transceiver 100 of FIGS. 1A-1B. More specifically, the active optical component subassembly 220 may include one or more components (e.g., 238 in FIG. 2D or 324 in FIG. 3) configured to perform conversions as described above. Additionally, the active optical component subassembly 220 may include one or more components (e.g., 600 in FIGS. 5A-6, 232 and/or 234 in FIG. 2D, or 322 in FIG. 3) that modify, monitor, amplify, and/or attenuate the signals. For example the components may modify, monitor, amplify, and/or attenuate the signals to conform to operating capabilities of a system implementing the COF OSA 200.

Specifically, two example functions of the COF OSA 200 can include transmission of optical signals and reception of optical signals. The transmission of optical signals can be accomplished if the active optical component subassembly 220 includes an optical transmitter. In this and other embodiments, electrical signals are received on the flex circuit 212 at the PCB flex connection 218 from a PCB such as the PCB 124 of FIG. 1B. The electrical signals are communicated along the flex circuit 212 to the active optical component subassembly 220 where the electrical signals are converted to optical signals and transmitted from the COF OSA 200 through the optical port 500.

The reception of optical signals can be accomplished if the active optical component subassembly 220 includes an optical receiver such as a photodetector. In this and other embodiments, optical signals are received through the optical port 500, converted to electrical signals by the active optical component subassembly 220 and communicated along the flex circuit 212 to the PCB flex connector 218. Some additional details of embodiments in which the optical signals are received are discussed with reference to FIG. 3.

With specific reference to FIGS. 2A and 2B, the COF OSA 200 is depicted as assembled. When assembled, the optical port 500 is attached to the flex circuit 212 at a flex connection 214. The flex circuit 212 can be a flexible printed circuit that generally includes conductive elements and flexible substrates. The flexible substrates may be composed of materials including, but not limited to, polyimide, polyester, polyether ether ketone, and/or polyethylene terephthalate (PET). In some embodiments, the conductive elements are formed on and/or between the flexible substrates. For example, the flex circuit 212 can include a copper strip laminated with layers of PET. Alternatively, the flex circuit 212 can include a silver circuit that is screen printed on a polyester substrate or the flex circuit 212 may be manufactured similarly to PCBs. These manufacturing methods may include laminating together dielectric layers with epoxy resin, coating the dielectric layers with a conductive layer such as, but not limited to, copper foil, then creating a circuit by removing or chemically etching an unwanted portion of the conductive layer from the dielectric layers. An example flex circuit 212 is described in more detail with respect to FIGS. 10A-10D.

The flex connection 214 refers to the connection between the optical port 500 and the flex circuit 212. The flex connection 214 can include a mechanical connection between the optical port 500 and the flex circuit 212. Example flex connections 214 may include joining materials such as polyimide, polyester, or polyethylene naphthalate and may be reinforced with materials such as polyimide, polyethylene terephthalate, aluminum and/or steel.

In some embodiments, the flex connection 214 may include an electrically insulating connection. Specifically in some embodiments, the flex connection 214 may electrically insulate the optical port 500 from the flex circuit 212. That is, the flex connection 214 may prohibit the transfer of electrical signals between the optical port 500 and the flex circuit 212 and may therefore further prohibit the transfer of electrical signals between the optical port 500 and a system (not shown) implementing the COF OSA 200.

The flex connection 214 can alternatively include an electrical connection that may for example, ground the optical port 500 and/or enable the conduction of electrical signals between the flex circuit 212 and the optical port 500. The flex connection 214 may further aid in suppressing electromagnetic radiation ("EMR") that results from operation of the COF OSA 200. For example, suppression of EMR may be implemented in embodiments in which both the optical port 500 and the flex connection 214 are composed of electrically conductive materials.

Additionally, depending on the one or more materials composing the flex connection 214 and the flex circuit 212, the flex connection 214 may also dissipate thermal energy from the optical port 500 through the flex circuit 212 via the flex connection 214. To assist in the transfer of heat from the optical port 500 and/or the active optical component subassembly 220, the COF OSA 200 may include a heat sink stiffener 216. The heat sink stiffener 216 may be configured to attach to the flex circuit 212. The heat sink stiffener 216 may act as a thermal sink to absorb thermal energy from the COF OSA 200, which thermal energy may be generated through operation of the COF OSA 200. Additionally, the heat sink stiffener 216 can physically stiffen the COF OSA 200. Some additional aspects of the heat sink stiffener 216 will be discussed with reference to FIG. 8.

The PCB flex connection 218 (FIG. 2A only) can include electrical contacts that are configured to be electrically coupled with a PCB such as the PCB 124 in FIG. 1B. With combined reference to FIGS. 1B-2B, the PCB 124 may be electrically coupled to the flex circuit 212 via the PCB flex connection 218 at the PCB connectors 130. A connection between the flex circuit 212 and the PCB 124 at the PCB flex connection 218 can be realized by a mechanized soldering process, a hand soldering processes, or a hot bar process, for example.

Referring next to FIGS. 2C and 2D, cut-away views of the COF OSA 200 are illustrated. As shown in FIGS. 2C and 2D, the COF OSA 200 can include the active optical component subassembly 220 positioned within the optical port 500. As discussed above, the active optical component subassembly 220 can include one or more optical or electrical components that enable operation of the COF OSA 200. For example, the active optical component subassembly 220 can include one or more optoelectric components that may be included in a TOSA, such as the TOSA 120 of FIG. 1B. The embodiment depicted in FIGS. 2C and 2D include optoelectric components that may be included in a TOSA. Specifically, in this and other embodiments, the active optical component subassembly 220 can include a plate 600, which is depicted transparently in FIG. 2D, a monitor PD 232, a spacer/heat spreader 234, wirebonds 236, and an optical transmitter 238 as described below.

Referring specifically to FIG. 2D, the active optical component subassembly 220 can be configured to fit inside a barrel cavity 224 when the COF OSA 200 is assembled. Additionally, one or more optical or electrical components included in the active optical component subassembly 220 may be mounted to the flex circuit 212 at an optical component subassembly connection region ("connection region") 222. Similar to the flex connection 214, the connection region 222 may include electrical connections and mechanical connections. Examples of the electrical connections may include wire bonding between one or more electrical contacts of the active optical component subassembly 220 and the conductive elements of the flex circuit 212. The electrical connections may include one or more wirebonds 236. Wire bonding can be performed by microwelding, thermo-compression wire bonding, or similar wire bonding processes. Example wirebonds can be composed at least partially of aluminum, copper, gold, any combination thereof or any combination thereof with other materials.

The active optical component subassembly 220 may be configured to be positioned and/or fixed within the barrel cavity 224. In some embodiments, some components included in the active optical component subassembly 220 are mounted to the flex circuit 212 and other components included in the active optical component subassembly 220 are fixed within the barrel cavity 224.

For example, the active optical component subassembly 220 can include the plate 600, the monitor PD 232, the spacer/heat spreader 234, one or more wirebonds 236, and the optical transmitter 238, which may include a light-emitting diode, a VCSEL, or the like. The plate 600 may be fixed in the barrel cavity 224 while the other components included in the active optical component subassembly 220 such as the monitor PD 232, the spacer/heat spreader 234, and the optical transmitter 238 may be mounted to the flex circuit 212 at the connection region 222. More specifically in this and other embodiments, the spacer/heat spreader 234 is mounted to the flex circuit 212 at the connection region 222. The optical transmitter 238 and the monitor PD 232 can be operably connected to the spacer/heat spreader 234. The connection region 222 may be configured to mechanically receive the spacer/heat spreader 234 and to secure the optical transmitter 238 physically at a specific position enabling alignment of the optical transmitter 238 and the monitor PD 232 within the optical port 500. The connection region 222 may be further configured to electrically connect the optical transmitter 238 and the monitor PD 232 to a system implementing the COF OSA 200, such as the transceiver 100 of FIGS. 1A-1B.

Figure 3:
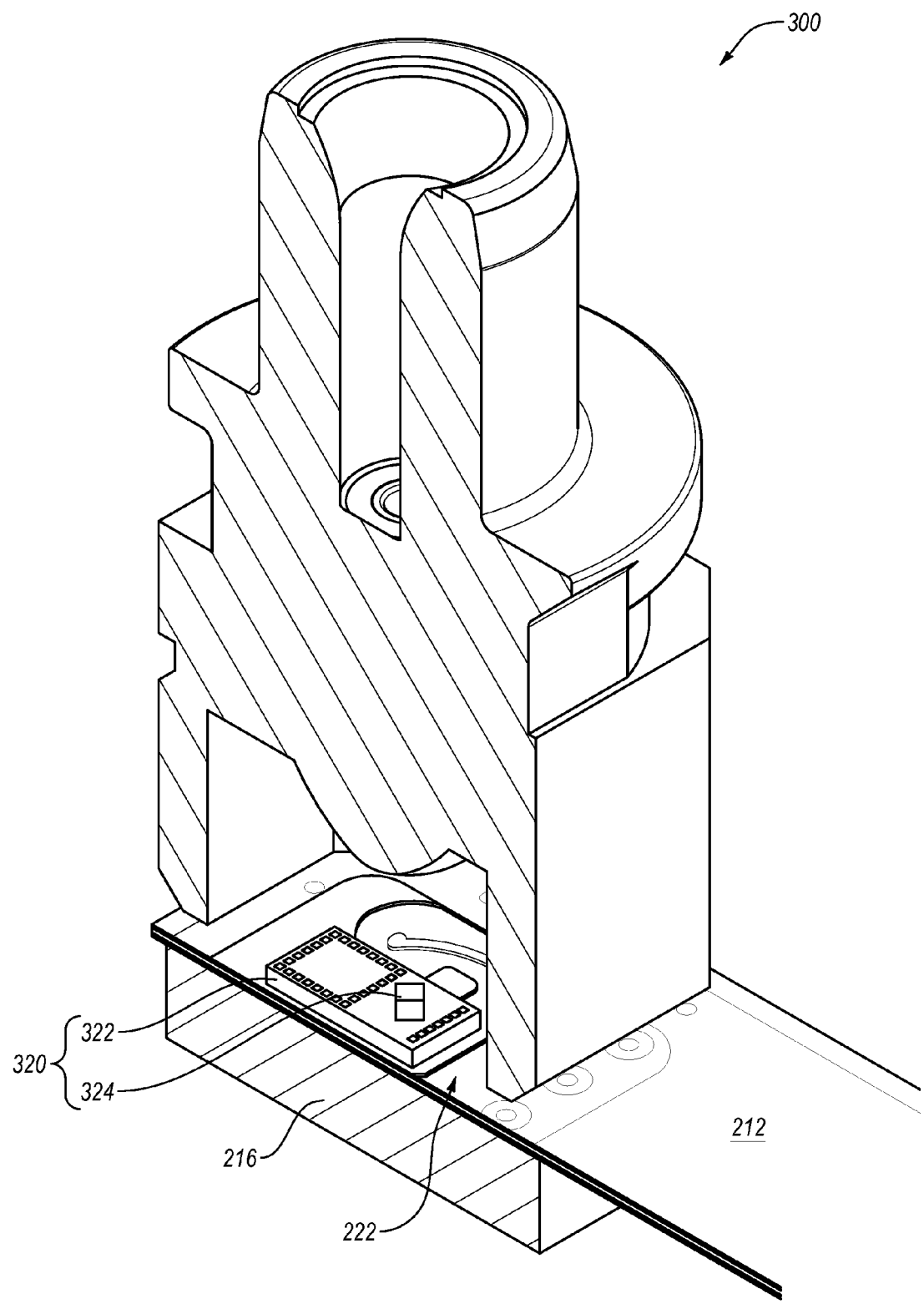
FIG. 3 illustrates another example COF OSA that may be implemented in the transceiver of FIGS. 1A and 1B.

FIG. 3 illustrates another example COF OSA 300 that may be included in the transceiver 100 of FIG. 1. The COF OSA 300 includes a ROSA active optical component subassembly 320. The ROSA active optical component subassembly 320 can include one or more optoelectric components that are generally included in a ROSA, such as the ROSA 122 of FIG. 1B. Specifically, in this and other embodiments, the ROSA active optical component subassembly 320 includes a photodiode 324 and an amplifier 322.

Other than the difference between the active optical component subassembly 220 of FIGS. 2C and 2D and the ROSA active optical component subassembly 320 of FIG. 3, the COF OSA 300 may be substantially similar to the COF OSA 200 of FIGS. 2A-2D. For example, the components (e.g., 500, 214, 216, 212, 218, 224, and 222) described with reference to FIGS. 2A-2D may function largely identically in the COF OSA 300 of FIG. 3. Accordingly, it is should be appreciated that the principles described herein with respect to the COF OSA 200 may also generally describe the COF OSA 300 of FIG. 3.

The components (i.e., 322 and 324) included in the ROSA active optical component subassembly 320 may be mounted to the flex circuit 212. Specifically, in the ROSA active optical component subassembly 320, the amplifier 322 can be mounted to the flex circuit 212 at the connection region 222 and the photodiode 324 can be operably connected, including being physically secured and electrically coupled, to the amplifier 322.

Figure 4:
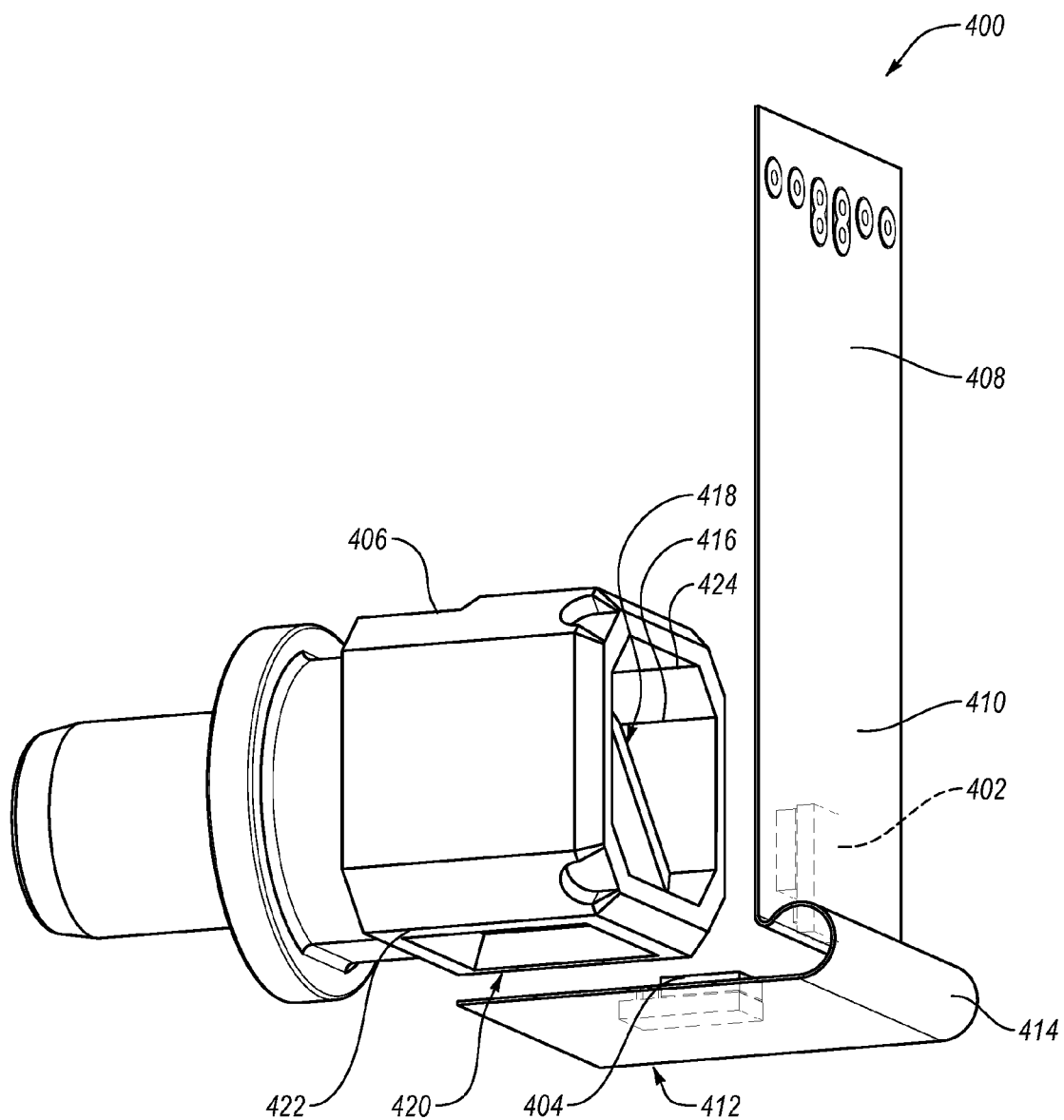
FIG. 4 illustrates another example COF OSA that that may be implemented in the transceiver of FIGS. 1A and 1B.

FIG. 4 illustrates another example COF OSA 400 that includes two active optical component subassemblies 402 and 404. FIG. 4 depicts a partially exploded perspective view of the COF OSA 400 in which an optical port 406 is illustrated displaced from a flex circuit 408, which is partially transparent. In general, the COF OSA 400 can include multiple active optical component subassemblies, therefore a single COF OSA may be configured to both transmit and receive optical signals. In the illustrated embodiment, the COF OSA 400 includes a transmit active optical component subassembly 402 and a receive active optical component subassembly 404.

The flex circuit 408 can include a transmit connection region 410, a receive connection region 412, and a bend 414. The transmit connection region 410 can provide a section of the flex circuit 408 including electrical connections for use of the transmit active optical component subassembly 402. Likewise, the receive connection region 410 can provide a section of the flex circuit 408 including electrical connections for use of the receive active optical component subassembly 404. The bend 414 can be substantially a hairpinlike bend such that the transmit connection region 410 and the receive connection region 412 are substantially normal to one another.

With combined reference to FIGS. 2A-2D, and 3B the flex circuit 408 can be longer that the flex circuit 212 of FIGS. 2A-2D. This allows the flex circuit 408 to extend along a bottom 424 and a side 422 of the optical port 406. In this and other embodiments, the receive connection region 412 is located on the portion of the flex circuit 408 that extends along the side 422 of the optical port 406. However, in alternative examples the transmit connection region 410 may be located on the portion of the flex circuit 408 that extends along the side 422 of the optical port 406.

The optical port 406 defines a barrel cavity 416 that can include two barrel openings 418 and 420. The barrel openings 418 and 420 allow the transmit active optical component subassembly 402 and the receive active optical component subassembly 404 to enter the barrel cavity 416. The barrel openings 418 and 420 are located on the side 422 and the bottom 424 of the optical port 406 such that the transmit active optical component subassembly 402 and the receive active optical component subassembly 404 are located on different planes within the barrel cavity 416.

The optical port 406 can be a monolithic component or an assembly of components that enables communications with one or more transmitters as well as one or more receivers through an optical network (not shown). In addition to the transmit active optical component subassembly 402 and the receive active optical component subassembly 404, the COF OSA 400 may include optical filters, electrical filters, and/or splitters such as a bidirectional (BiDi) optical filter configured to allow a transmit optical signal emitted by an optical transmitter of the transmit active optical component subassembly 402 to pass therethrough, and further configured to reflect a receive optical signal towards an optical receiver in the receive active optical component subassembly 404.

Alternatively, some COF OSA may include one or more components configured to transmit and/or receive one or more optical signals on one or more predetermined wavelength division multiplexing (WDM) channels. For instance, a laser or other optical transmitter configured to emit optical signals on a predetermined WDM channel may be provided, and/or an array of lasers or other optical transmitters may be provided that are configured to emit optical signals on different predetermined WDM channels. Alternately or additionally, an optical receiver or array of optical receivers may be provided that are configured to receive one or more optical signals on one or more different predetermined WDM channels. The predetermined WDM channels may include one or more coarse wavelength division multiplexing (CWDM) channels (e.g., about 100 GHz spacing), one or more dense wavelength division multiplexing (DWDM) channels (e.g., about 50 GHz or 25 GHz spacing), or the like or any combination thereof.

The active optical component subassembly 220 (FIGS. 2C and 2D), the ROSA active optical component subassembly 320 (FIG. 3), and/or the transmit active optical component subassembly 402 and receive active optical component subassembly 404 (FIG. 4) are each illustrated and discussed as a single subassembly. However, the grouping of components in these subassemblies 220, 320, 402, and 404 is not meant to be limiting. That is, the components included in these subassemblies 220, 320, 402, and 404 are not necessarily installed at a same time or in the same process of constructing a COF OSA 200 or 300. For example, in the embodiment illustrated in FIG. 2D, the active optical component subassembly 220 may be fixed within the barrel cavity 224 or mounted to the flex circuit 212 in any order as determined by manufacturing and/or functional considerations. For example, the plate 600 may be installed in the barrel cavity 224 of the optical port 500 during the manufacturing of the optical port 500 and the spacer/heat spreader 234 may be mounted to the flex circuit 212 during manufacture of the flex circuit 212. The optical port 500 may then be secured to the flex circuit 212 in a subsequent process.

With reference to FIGS. 5A-9, some additional details of components that may be included in COF OSAs such as the COF OSAs 200, 300, or 400 are described. Note in some of the COF OSAs 200, 300, or 400 some features of characteristics of the components may vary from those presented with reference to FIGS. 5A-9. The features and variations thereof may relate to a specific function or operation of the COF OSA.

Figure 5A:
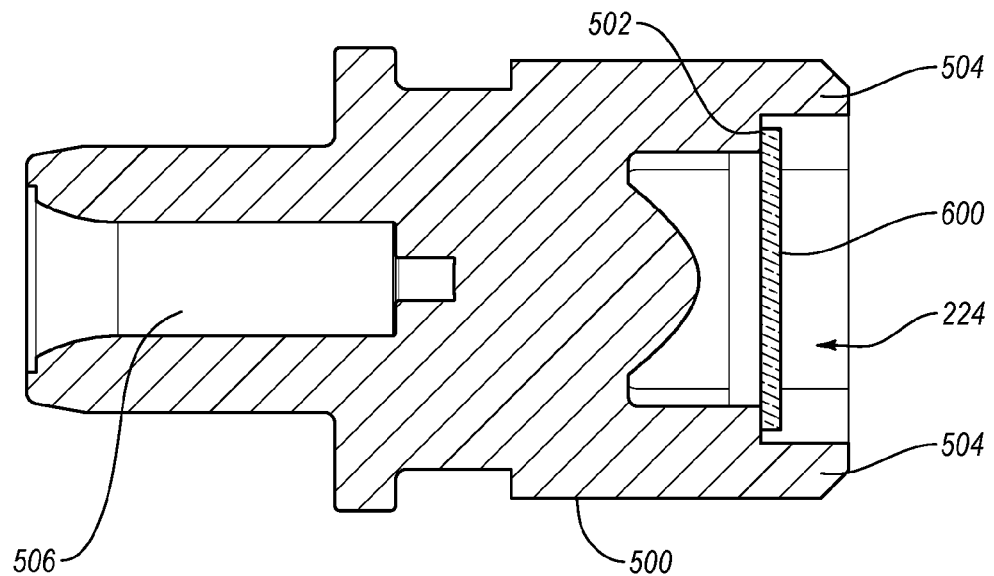
FIGS. 5A and 5B illustrate an example optical port that may be implemented in the COF OSA of FIGS. 2A-2D.
Figure 5B:
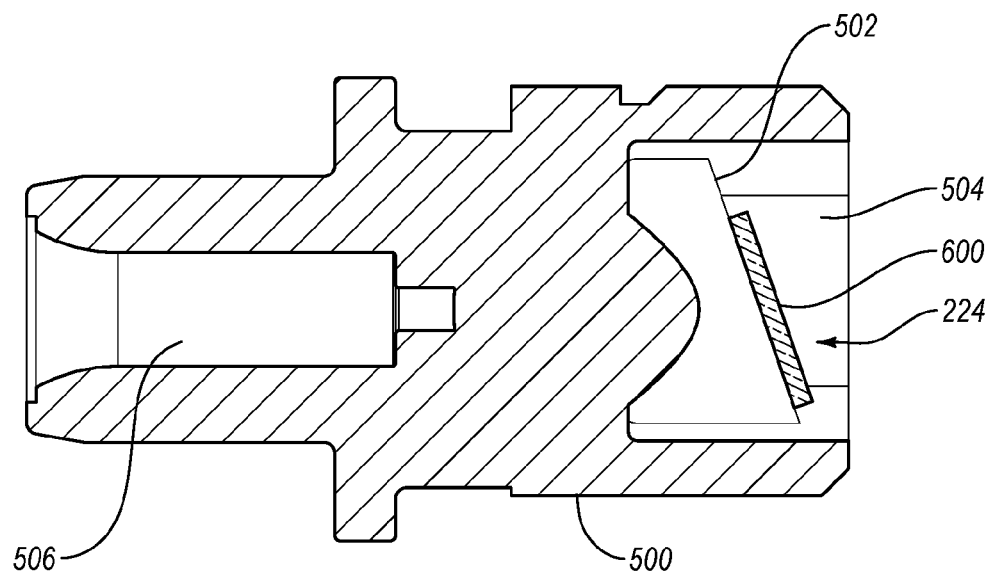

FIGS. 5A-5B illustrate some additional details of the optical port 500. As discussed above, the optical port 500 may be implemented in the COF OSA 200 depicted in FIGS. 2A-2D. FIGS. 5A and 5B present cut away views of the optical port 500. A sectional plane from which FIG. 5A is generated is substantially normal to the sectional plane from which FIG. 5B is generated. Generally, the optical port 500 can be a single molded element, which may be composed of materials including, but not limited to, plastic or glass.

The optical port 500 may define a fiber receptacle 506 that is configured to receive an optical fiber (not shown). Specifically the fiber receptacle 506 allows the insertion of an optical fiber into the optical port 500 such that optical signals may be transmitted to or received from a system (not shown). The fiber receptacle 506 depicted in FIGS. 5A-5B is configured to receive one optical fiber. However, in alternative embodiments, the fiber receptacle 506 may be configured to receive one optical fiber, multiple optical fibers, and/or fiber optic pigtails. Example fiber optic pigtails may be compliant to IEC, TIA/EIA, NTT, and/or JIS specifications. Fiber receptacles 506 configured to receive multiple optical fibers and/or fiber optic pigtails may have varying physical dimensions and/or additional or alternative features attached or incorporated into the optical port 500. Additionally, in such embodiments, the optical port 500 may be configured as a permanent pigtail assembly.

The optical port 500 may further define the barrel cavity 224 introduced above. The barrel cavity 224 can be configured such that the plate 600 may be fixed within it. Accordingly, the barrel cavity 224 can include inner walls 504 defining the tilted molded recess 502. As best illustrated in FIG. 5A, the tilted molded recess 502 may be defined by material removed from the inner walls 504 creating a step-like cross-sectional shape of each of the inner walls 504.

The tilted molded recess 502 may have a substantially trapezoidal cross-sectional shape including one angled edge to which the plate 600 is fixed. The angled edge enables the plate 600 to be fixed at an angle. The plate 600 may be supported by portions of the inner walls 504 left following the material removal process. The plate 600 is substantially supported along one or more edges of the plate 600 leaving an un-obscured section of the plate 600, such as a middle area of the plate 600, unsupported.

Alternatively, the tilted molded recess 502 may be molded with the optical port 500 as part of the inner walls 504. If the tilted molded recess 502 is molded with the optical port 500, then the tilted molded recess 502 can be integral to the optical port 500. Alternatively still, a plate support insert defining the tilted molded recess 502 may be produced or manufactured in a separate process and later attached to the inner walls 504 of the optical port 500. The plate support insert may be attached via an epoxy, a fastener, a press fit, or any other suitable attachment means/methods.

The plate 600 may be attached to the tilted molded recess 502 through a structural epoxy or may be attached via one or more fasteners, a press fit, etc. Additionally, in some embodiments, the plate 600 can be attached by some affixing apparatus that may include, but is not limited to, one or more protrusions, one or more cutouts, one or more fasteners, an adhesive, and/or one or more retainers.

In this and other embodiments, the optical port 500 can fix the plate 600 in a specific position relative to the fiber receptacle 506, which secures an optical fiber. Fixing the plate 600 in the optical port 500 may eliminate the need to include a plate in a TO can. Additionally or alternatively, the optical fiber and the plate 600 may remain substantially aligned because the optical fiber and the plate 600 are both secured by the optical port 500.

In alternative embodiments, the optical port 500 may omit the plate 600. For example, the COF OSA 300 depicted in FIG. 3 can omit the plate 600. Inclusion of the plate 600 in the optical port 500 can be determined by the function of particular COF OSA.

Figure 6:
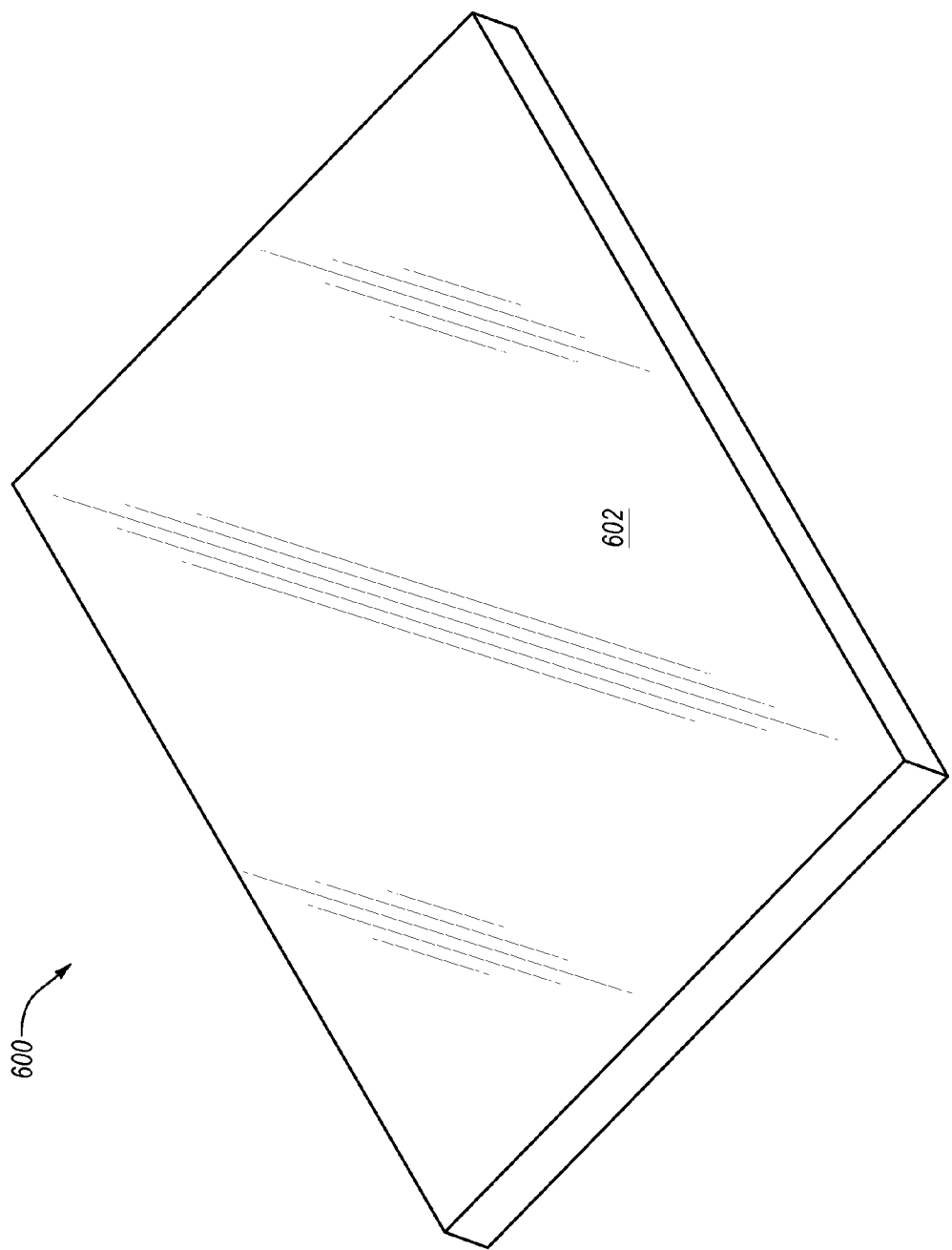
FIG. 6 illustrates an example plate that may be implemented in the COF OSA of FIGS. 2A-2D.

FIG. 6 illustrates some additional details of the plate 600. As discussed above, the plate 600 may be implemented in the optical port 500 depicted in FIGS. 5A and 5B. The plate 600 may be composed of a variety of materials including, but not limited to, plastic or glass. In this and other embodiments, the plate 600 has a substantially rectangular cross-section. However, the plate 600 may take alternative geometries as can be determined by the configuration of an optical port or potentially other economic or functional considerations.

The plate 600 can include a prescription. As used with reference to the plate 600, the term prescription may refer to particular focusing, reflective, and/or attenuating properties. A specific prescription of the plate 600 can be the same prescription as a TO can plate that the plate 600 is replacing. For example, if a COF OSA is configured to function as a 14G TOSA implementing a VCSEL, the prescription of the plate 600 may be identical to that of a TO-46 plate. Alternatively, the prescription of the plate 600 may vary from the corresponding TO can plate. For example, the prescription may be determined by the configuration of the optical port 500 and/or the configuration of another component such as the optical transmitter. In some embodiments, the plate 600 can include an optical power that may correspond to a particular focal length similar to a lens that may aid in focusing optical signals.

The plate 600 may also be configured to attenuate an optical signal transmitted through the plate 600. Specifically, the plate 600 may reflect a portion of the optical signal emitted by the corresponding optical transmitter to a corresponding monitor PD. With combined reference to FIGS. 2D and 6, the plate 600 is angled in the illustrated embodiment such that a portion of the optical signal emitted by the optical transmitter 238 may be reflected to the monitor PD 232. The reflected portion may provide some information related to the operating condition of the optical transmitter 238. In this and other embodiments, the monitor PD 232 may communicate information based on the reflected portion of the optical signal to another system which in turn may modify one or more operating conditions of the optical transmitter. The reflection may be accomplished through a coating on one or more surfaces 602 of the plate 600.

As stated above, by fixing the plate 600 to an optical port such as the optical port 500 of FIGS. 5A and 5B, the inclusion of a TO can with a plate may be eliminated. The elimination of the TO can may reduce the overall complexity of the COF OSA. Additionally, fixing the plate 600 to the optical port may allow variation in reflection and/or attenuation through the modification and/or substitution of the plate 600 and/or the optical port.

Figure 7:
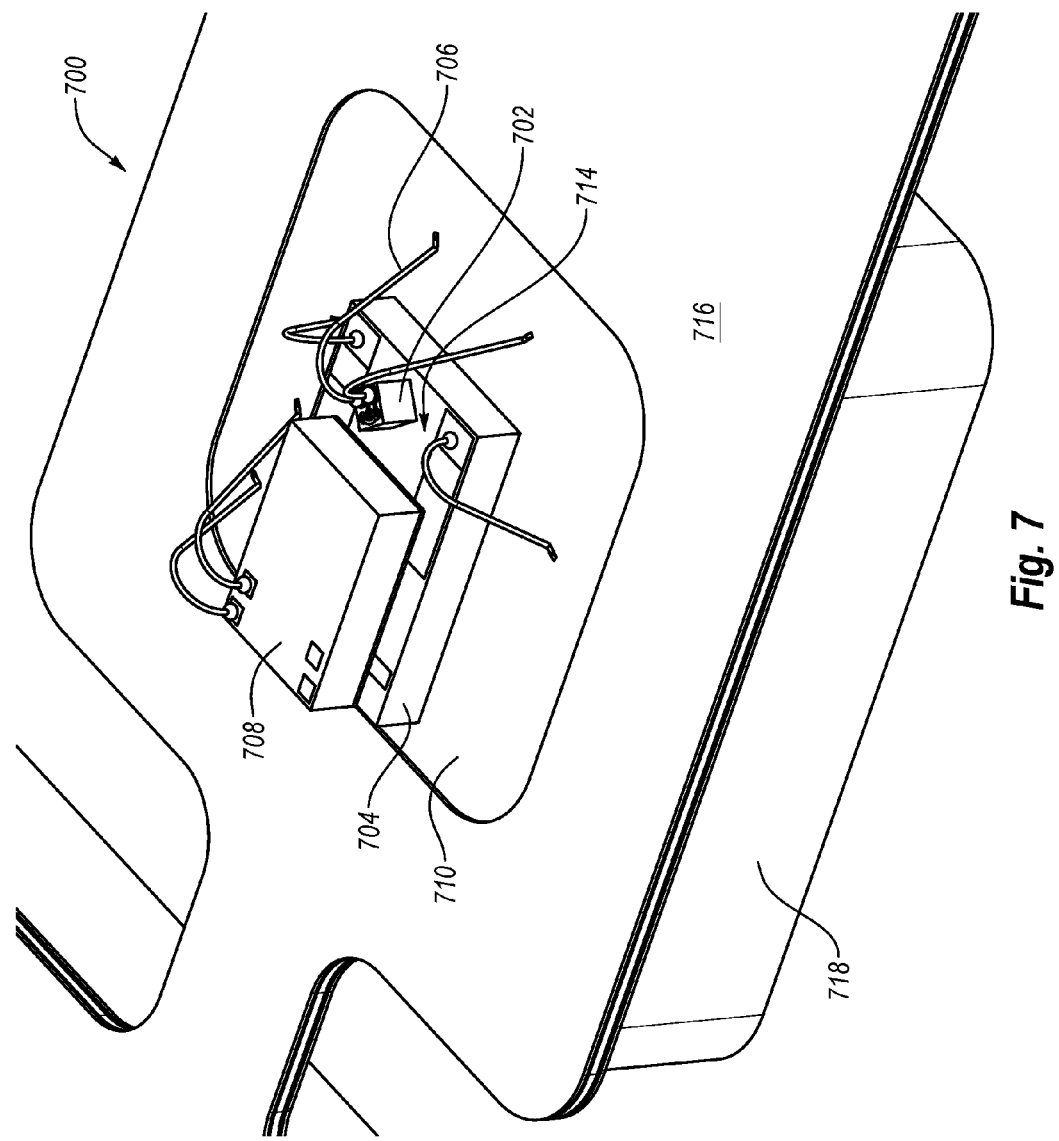
FIG. 7 illustrates an example active optical component subassembly that may be implemented in the COF OSA of FIGS. 2A-2D.

FIG. 7 illustrates an example active optical component subassembly 700 which may be implemented in the COF OSA 200 of FIGS. 2A-2D. Similar to the active optical component subassembly 220 depicted in FIGS. 2C and 2D, the active optical component subassembly 700 can include an optical transmitter 702, a spacer/heat spreader 704, wirebonds 706, and a monitor PD 708 (collectively, the optical transmitter 702, the spacer/heat spreader 704, and the monitor PD 708 are referred to as the "components 702/704/708" with reference to FIG. 7). The components 702/704/708 are not limiting to the scope of the invention. For example, additional or alternative components that may be included in the active optical component subassembly 700 and/or elsewhere in the COF OSA including the active optical component subassembly 700. The additional or alternative components may include, but are not limited to, an optical filter, a resistor, a capacitor, integrated circuits (ICs) such as a laser driver IC and/or a post amplifier IC, or the like or any combination thereof.

In the embodiment depicted in FIG. 7, an optical port has been omitted for clarity and the components 702/704/708 are illustrated affixed to a connection region 710. The active optical component subassembly 700 is configured to be positioned within and fit inside a barrel cavity of the omitted optical port. The barrel cavity can be similar to the barrel cavity 224 depicted in FIGS. 2D, 5A, and 5B, for instance.

The spacer/heat spreader 704 is secured to a flex circuit 716 at the connection region 710. As above, the connection region 710 may include an electrical connection and/or a mechanical connection. An example mechanical connection may be created through use of an epoxy, a glue, a fastener, or a solder. Generally, the mechanical connection enable the proper positioning of the spacer/heat spreader 704 within a COF OSA such that a transmitted optical signal is aligned for function of the COF OSA. Additionally, the mechanical connection can secure the spacer/heat spreader 704 to the flex circuit 716. Aspects of some example electrical connections are discussed below.

In some alternative embodiments, the spacer/heat spreader 704 may be secured to a heat sink stiffener 718. In these and other embodiments, the connection region 710 may define an opening allowing the spacer/heat spreader 704 to contact the heat sink stiffener 718.

The spacer/heat spreader 704 may be composed of aluminum nitride or another material. Functionally, the spacer/heat spreader 704 may be configured to enable the optical transmitter 702 to be secured on a spacer top surface 714. The physical contact between the spacer top surface 714 and the optical transmitter 702 can allow thermal energy generated during operation of the optical transmitter 702 to dissipate or transfer to the spacer/heat spreader 704 and subsequently to the heat sink stiffener 718. The transfer of thermal energy may enable temperature control of a COF OSA and can enhance the performance of the optical transmitter 702.

Additionally or alternatively, the spacer/heat spreader 704 may include a film resistive element that may act as a heater. The film resistive element may heat the PD monitor 708 and/or the optical transmitter 702 for instance to ensure or maintain a particular temperature. The film resistive element can be located on the spacer top surface 714 or may be integrated into the spacer/heat spreader 704. Additionally, the film resistive element may vary in thickness and/or dimension to provide, for example, a specific quantity of heating to a certain area and/or specific optical component 702/704.

The optical transmitter 702 can include, but is not limited to, a VCSEL, a laser diode, an edge emitting laser, an FP laser, a DFB laser, or other suitable optical transmitter. The optical transmitter 702 may be mechanically coupled to the spacer top surface 714. The optical transmitter 702 receives electrical signals via one or more wirebonds 706 that drive the optical transmitter 702 to emit optical signals representative of the electrical signals. During operation of the optical transmitter 702, thermal energy can be generated, which may be dissipated through the spacer/heater spreader 704 and the heat sink stiffener 718 as already described.

The monitor PD 708 may be affixed to the spacer top surface 714 and may be electrically coupled to the connection region 710 via one or more of the wirebonds 706. Functionally, the monitor PD 708 may be configured to receive a portion of an optical signal reflected from a plate. The monitor PD 708 may be further configured to convert the reflected portion to an electrical signal which is communicated to another system. Accordingly, and as illustrated in FIG. 7, the monitor PD 708 may be electrically coupled to the connection region 710 via one or more of the wirebonds 706. The wirebonds 706 carry the electrical signals from the monitor PD 708 to a corresponding contact in the connection region 710, which may be electrically coupled to other system.

Figure 8:
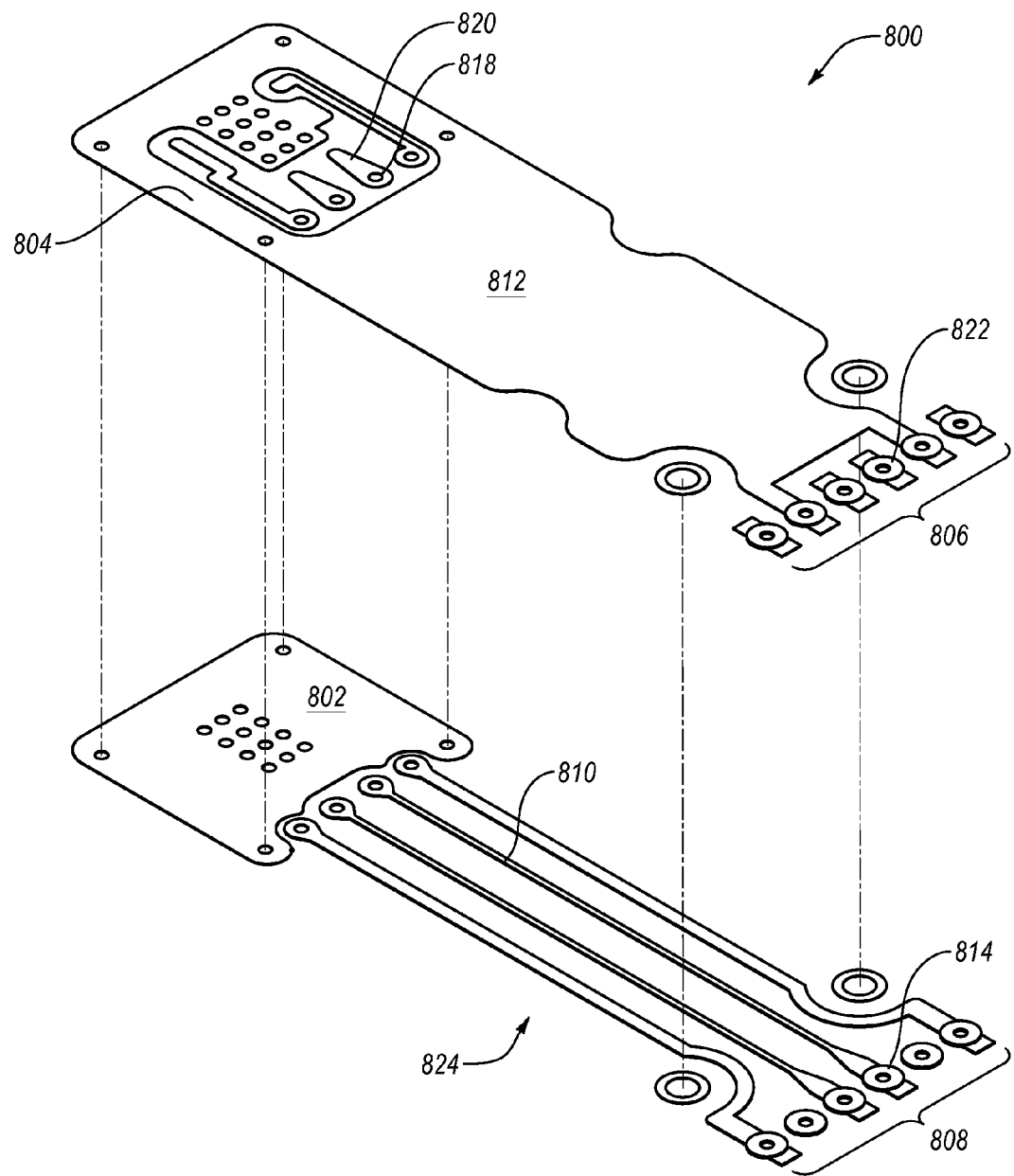
FIG. 8 illustrates an example top conductive element and bottom conductive element that may be implemented in the COF OSA of FIGS. 2A-2D.

FIG. 8 illustrates conductive elements 800 and 824 which may be integrated into the active optical component subassembly 700 of FIG. 7. More specifically, FIG. 8 includes a top conductive element 800 displaced from a bottom conductive element 824. Generally, the top conductive element 800 and the bottom conductive element 824 are composed of conductive materials such as metal or the like. Additionally in FIG. 8, the electrical insulator layer is omitted between the top conductive element 800 and the bottom conductive element 824.

The top conductive element 800 can include top component contacts 804, a top conductive length 812, and top PCB flex connections 806. Similarly, the bottom conductive element 824 can include bottom component contacts 802, a bottom conductive length 810, and a bottom PCB flex connection 808. When assembled, as discussed with reference to FIG. 10A-10D, a flex circuit may include one or more insulator layers between the top conductive element 800 layered on top of the bottom conductive element 824. The insulator layer(s) can be configured to provide discrete contacts between the top conductive element 800 and the bottom element 824.

With combined reference to FIGS. 7 and 8, The top component contacts 804 and the bottom component contacts 802 may combine to form the connection 710. The top component contacts 804 and the bottom component contacts 802 enable the electrical coupling of the components 702/704/708 to the connection region 710 of the flex circuit 716 such that electrical signals may be communicated between the components 702/704/708 and the connection region 710 of the flex circuit 716. For example, in the embodiment of the active optical component subassembly 700 of FIG. 7, the optical transmitter 702, the spacer/heat spreader 704, and the monitor PD 708 may be electrically coupled to either the top component contacts 804 and/or the bottom component contacts 802. The optical transmitter 702, the spacer/heat spreader 704, and the monitor PD 708 may communicate electrical signals through the connection region 710 of the flex circuit 716 to a corresponding PCB and/or vice versa.

With combined reference to FIGS. 2D and 8, the PCB flex connection 218 can include the top PCB flex connection 806 and the bottom flex connection 808. The top PCB flex connection 806 and the bottom PCB flex connection 808 may enable the communication of electrical signals from a PCB to a flex circuit and vice versa.

The general electrical configuration and general electrical capability/interface of a COF OSA may be determined by the configuration of conductive elements of a flex circuit. To illustrate, in FIG. 8 an example electrical path is described. A first electrical path can begin at a first connector 814. The first connector 814 is one electrical contact of the bottom PCB connection 808. Note, when assembled with the top conductive element 800 layered on top of the bottom conductive element 824, the first connector 814 would align with a contact 822 in the top PCB connection 806. However, the aligning contact 822 is not electrically connected to anything. Thus, an electrical signal introduced on the first connector 814 or the aligning contact 822 may follow the first electrical path as described herein.

The first connector 814 can be electrically coupled to a PCB enabling the communication of electrical signals with the PCB. In this example, first connection 814 may receive an electrical signal from the PCB. The electrical signal received from the PCB can be communicated through the bottom conductive length 810. In this example, the electrical signal may be communicated through the portion of the bottom conductive length 810 connecting the first connector 814 to a second connector 816. When assembled, a portion of an insulator layer may be disposed between the bottom conductive length 810 and the top conductive length 812 to prevent the electrical signal from being communicated to the top conductive length 812.

After the electrical signal reaches the second connector 816, it may be communicated to a third connector 818 which is part of the top conductive element 800. As opposed to the area between the top conductive length 812 and the bottom conductive length 810, an insulator layer may not separate the second connector 816 from the third connector 818. Alternatively, a physical connector such as a rod may connect the second connector 816 to the third connector 818. From the third connector 818, the electrical signal may be communicated to a component contact 820. The component contact 820 may be coupled to a wirebond such as one of the wirebonds 706 that carries the electrical signal to an electrical contact on an optical component, such as the optical transmitter 702 or the monitor PD 708 of FIG. 7.

The configuration depicted in FIG. 8 represents an example configuration. The top conductive element 800 and the bottom conductive element 824, including the top component contacts 804, the top conductive length 812, the top PCB flex connections 806, the bottom component contacts 802, the bottom conductive length 810, and the bottom PCB flex connection 808 may take various configurations as required by the particular application and the components included in an active optical component subassembly.

Additionally or alternatively, a flex circuit may include a single conductive element or multiple conductive elements, and/or the flex circuit may be configured as a waveguide. For example, in some embodiments, the top conductive element 800 and/or the bottom conductive element 824 can be configured as a radio frequency ("RF") waveguide. In this configuration, the flex circuit can carry RF signals via the top conductive element 800 and/or the bottom conductive element 824 to and from the COF OSA. In these and other embodiments, the RF performance may be better than OSAs that use a TO can because the flex circuit removes the need of feeding one or more RF pins through the TO can which may eliminate and/or reduce electrical discontinuities compared to a TO can with RF pins.

Figure 9:
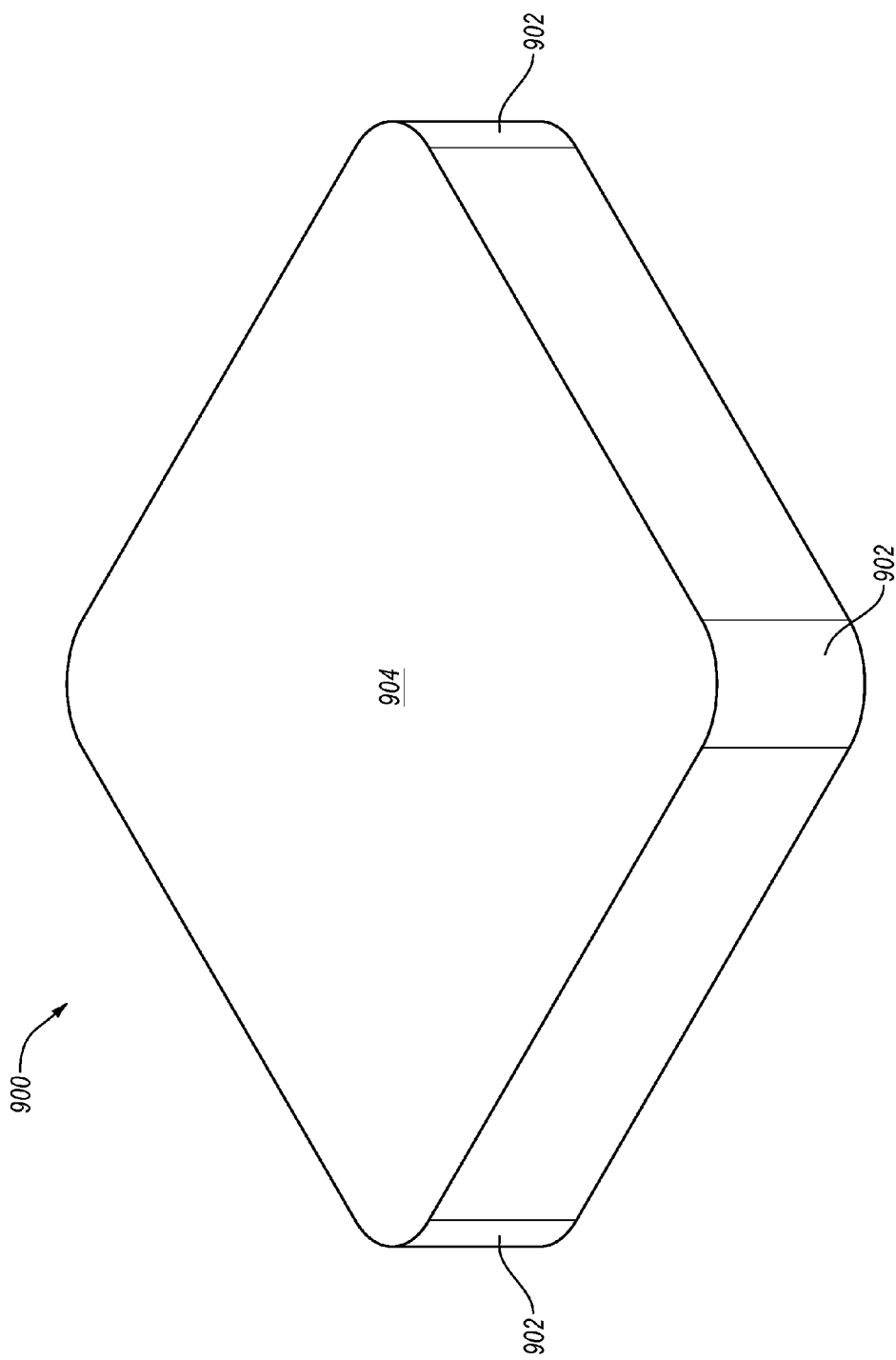
FIG. 9 illustrates a heat sink stiffener that may be implemented in the COF OSA of FIGS. 2A-2D.

FIG. 9 illustrates an example heat sink stiffener 900. The heat sink stiffener 900 may correspond to the heat sink stiffener 718 of FIG. 7 and/or the heat sink stiffener 216 of FIGS. 2A-3. Generally, the heat sink stiffener 900 may be composed at least partially of a thermally conductive material such as copper and/or aluminum. The copper and/or aluminum may be mixed with other materials in some embodiments.

The heat sink stiffener 900 may have a substantially rectangular footprint with rounded corners 902 as depicted in FIG. 9. In alternative embodiments, the heat sink stiffener may have a footprint with an alternative shape. Alternately or additionally, the heat sink stiffener 900 can be substantially flat on a contact face 904.

Functionally, the heat sink stiffener 900 can act as a heat sink for a COF OSA, such as the COF OSA 200 of FIGS. 2A-2D. The thermal energy generated through operation of the COF OSA may be transferred to the heat sink stiffener 900. The transfer of thermal energy to the heat sink stiffener 900 in embodiments of a COF OSA as described herein may improve performance of the COF OSA and/or may increase the life of the COF OSA compared to OSAs with conventional TO cans.

An additional or alternative function of the heat sink stiffener 900 may be to stiffen a flex circuit during assembly of a COF OSA. Specifically, the heat sink stiffener may support a corresponding flex circuit, which may be pliable as described above, during a mounting or attaching of other components.

Alternately or additionally, the heat sink stiffener 900 may include a physical connection such as a rod or set of rods. Each rod or set of rods may couple one or more components included in an active optical component subassembly to the heat sink stiffener 900. For example, with combined reference to FIGS. 7 and 9, the spacer/heat spreader 704 may include a thermal contact that coincides with the physical connection of the heat sink stiffener 718. In this example, the physical connection can be positioned on the contact face 904. The physical connection may extend through the flex circuit 716 to ensure or augment the transfer of thermal energy to the heat sink stiffener 718.

Figure 10A:
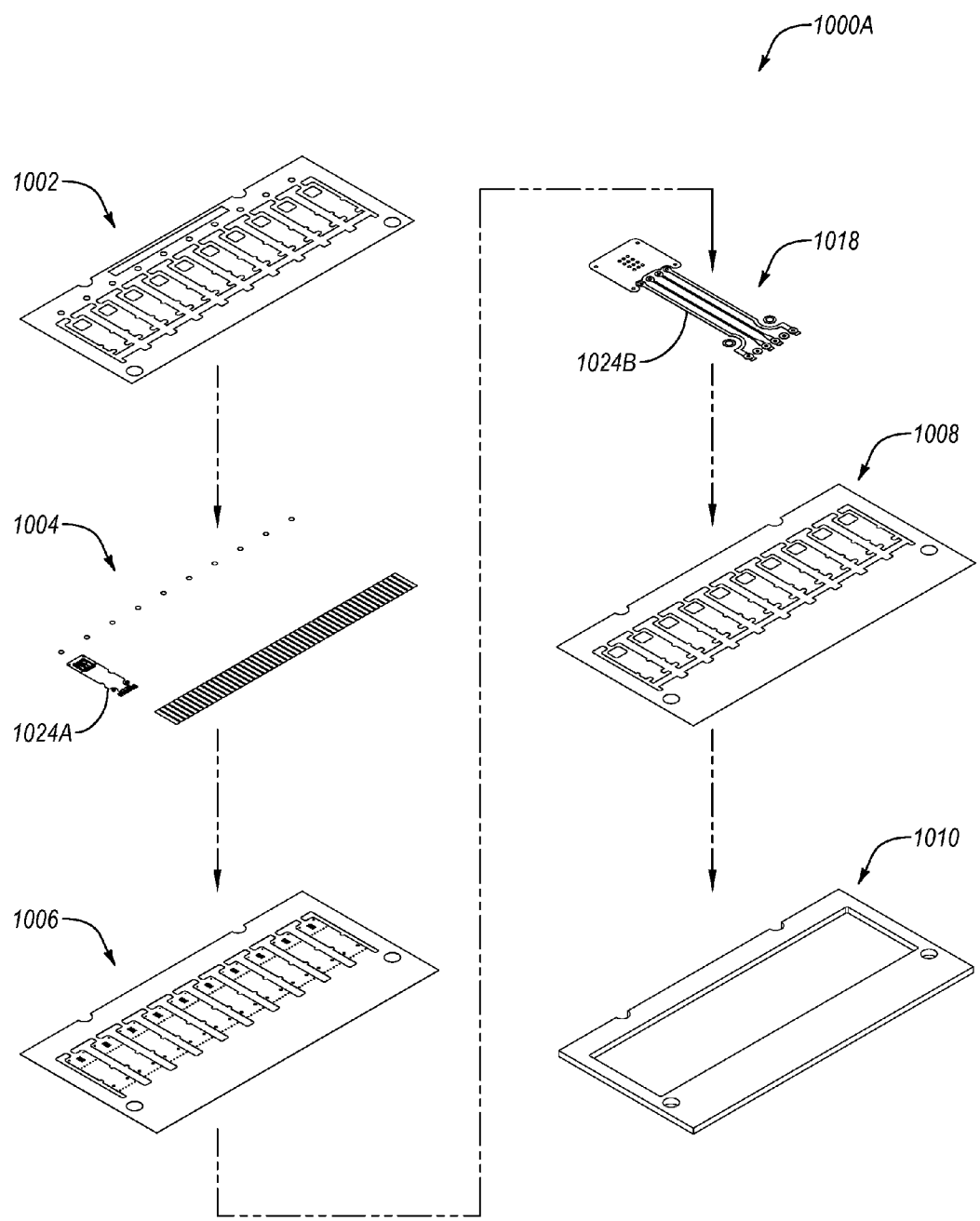
Figure 10B:
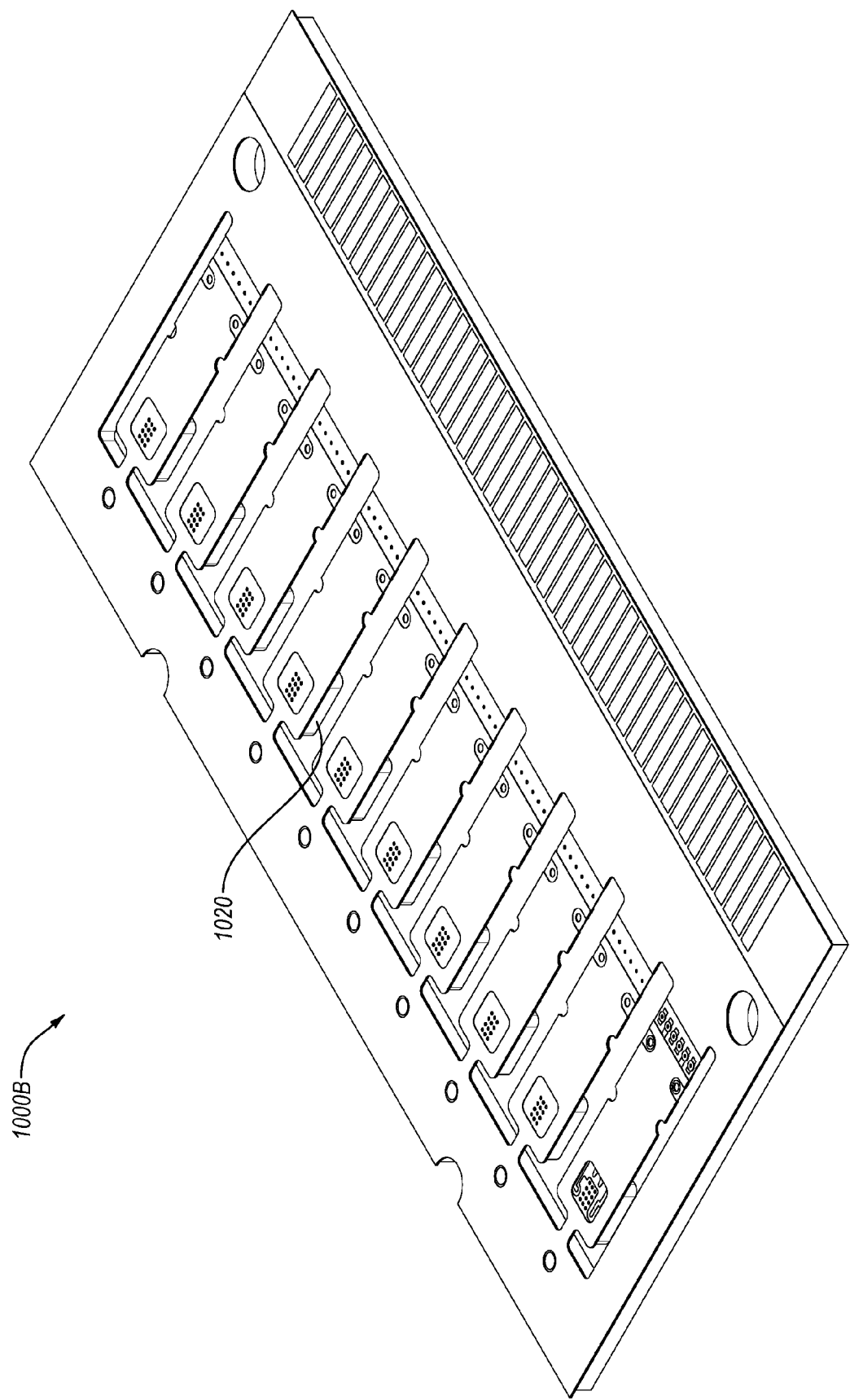
Figure 10C:
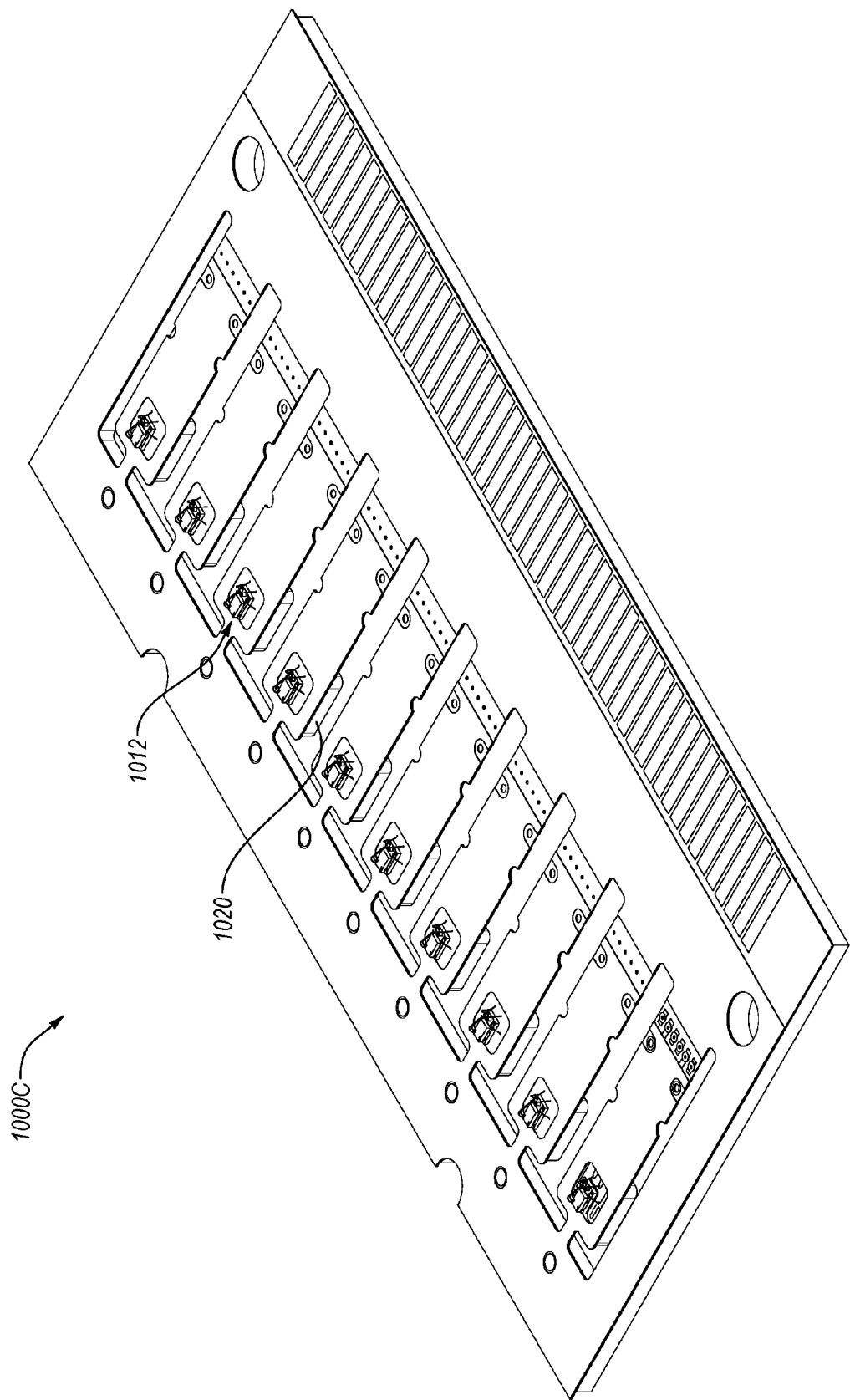

As discussed throughout, a COF OSA generally includes a flex circuit, various components included in an active optical component subassembly, and an optical port. The flex circuit may be constructed of layers which include conductive layers and insulator layers. The components can be mounted, electrically and mechanically, to the flex circuit and disposed within the optical port. sweet FIGS. 10A-10D illustrate an example construction process of an array of COF OSAs. The construction process includes intermediate structures 1000A-1000D. Specifically FIG. 10A illustrates a first intermediate structure 1000A including multiple layers (1002, 1004, 1006, 1018, and 1008) that may be included an array of flex circuits. FIG. 10B illustrates a second intermediate structure 1000B including an array of completed flex circuits. FIG. 10C illustrates a third intermediate structure 1000C including an array of completed flex circuits with active optical component subassemblies 1012 mounted on the completed flex circuits. FIG. 10D illustrates a fourth intermediate structure 1000D including an array completed flex circuits with the optical ports 1016 further mounted on the completed flex circuits and with the active optical component subassemblies positioned within the optical ports. From the fourth intermediate structure 1000D depicted in FIG. 10D, individual OSAs may be cut. The fourth intermediate structure 1000D depicted in FIGS. 10A-10D may produce ten COF OSAs. However, this is not meant to limit the scope of the invention. The number of COF OSAs the fourth intermediate structure 1000D may produce can be more than ten or fewer than ten.

The construction process depicted in FIGS. 10A-10D is shown for an embodiment of COF OSAs similar to those depicted in FIGS. 2A-2D, and 5A-9. However, this is not meant to be limiting. The construction process of FIGS. 10A-10D may be applied to other types of COF OSA embodiments. Specifically, the construction process of FIGS. 10A-10D may be performed for the COF OSAs 300 and 400 depicted in FIGS. 3 and 4 as well as embodiments that include WDM components.

Referring now to FIG. 10A, the first intermediate structure 1000A is illustrated with multiple component layers 1002, 1004, 1006, 1018, 1008, and 1010 exploded from one another. The component layers can include a top cover 1002, a top metal 1004, a core 1006, a bottom metal 1018, a bottom cover 1008, and a perimeter-mounting structure 1010. The top cover 1002, the core 1006, and the bottom cover 1008 may be insulator layers (collectively, insulator layers 1002/1006/1008). The top metal 1004 and the bottom metal 1018 may be conductive layers (collectively, conductor layers 1004/1018). The insulator layers 1002/1006/1008 may be composed of materials that do not conduct electricity and are at least partially pliable. Example materials that may be included in the insulator layers 1002/1006/1008 are listed with reference to FIGS. 2A-2D. The insulator layers 1002/1006/1008 can isolate conductive layers 1004/1018 to prevent or limit electrical signals from being inadvertently conducted between conductive layers 1004/1018 or from conductive layers 1004/1018 externally. Additionally, the insulator layers 1002/1006/1008 may contribute to the flexibility and overall support of a flex circuit.

The insulator layers 1002/1006/1008 are generally larger than just COF OSAs. For example, referring to the top cover 1002, a top cover boarder 1022 surrounds the portion of the top cover 1002 included in the COF OSAs. The insulator layers 1002/1006/1008 similarly include material that surrounds the portion included in the COF OSAs (collectively "borders"). The boarders adhere to the perimeter-mounting structure 1010 (discussed below) in some embodiments.

The conductive layers 1004/1018 may substantially define the top conductive element and the bottom conductive element of a flex circuit, such as the top conductive element 800 and the bottom conductive element 824 depicted in FIG. 8. The top metal 1004 and the bottom metal 1018 are depicted as a single conductive element 1024A or 1024B in FIG. 10A. Each single conductive element 1024A, 1024B represents an electrical configuration that is repeated for each COF OSA.

The perimeter-mounting structure 1010 is not a layer included in the finished COF OSAs. Instead, the perimeter-mounting structure 1010 may be included during the example construction process to support the insulator layers 1002/1006/1008 and the conductive layers 1004/1018. When the COF OSAs are cut from the array 1000A, the perimeter-mounting structure 1010 may be reused during a subsequent construction process.

The top cover 1002, the top metal 1004, the core 1006, the bottom metal 1018, the bottom cover 1008, and the perimeter-mounting structure 1010 may be epoxied or otherwise connected together to create the second intermediate structure 1000B which is an array of completed flex circuits.

The second intermediate structure 1000B is depicted in FIG. 10B. The second intermediate structure 1000B further includes multiple heat sink stiffeners 1020. Only one of the heat sink stiffeners 1020 is labeled in FIG. 10B. The heat sink stiffeners 1020 can be substantially similar to the heat sink stiffener 800 in FIG. 8, for example. Each of the heat sink stiffeners 1020 can be attached as a support mechanism. For example, the conductive layers 1004/1018 and the insulator layers 1002/1006/1008 can be substantially pliable, thus the heat sink stiffeners 1020 can support the conductive layers and the insulator layers during the mounting of the active optical component subassemblies 1012 in FIG. 10C.

The third intermediate structure 1000C depicts the mounting of the active optical component subassemblies 1012 to each of the COF OSAs. There may be at least two example sub-processes for mounting of the active optical component subassemblies 1012. Specifically, a flex circuit may include a connection region opening defined by the top cover 1002, the top metal 1004, the core 1006, the bottom metal 1018, and the bottom cover 1008. In these embodiments, the active optical component subassembly 1012 can be mounted directly to the heat sink stiffener 1020. When the active optical component subassembly 1012 is mounted to the heat sink stiffener 1020, thermal energy may transfer to the heat sink stiffener 1020 without moving through the first flex circuit 1024A.

Alternatively, a flex circuit may include a solid connection region. In these embodiments, the flex circuit is affixed or otherwise attached to the heat sink stiffener 1020. The active optical component subassembly 1012 is then mounted to the solid connection region.

The construction process can additionally include mounting of the optical ports 1016 as depicted in the fourth intermediate structure 1000D in FIG. 10D. In FIG. 10D, only one of the optical ports 1016 is labeled. The optical ports 1016 can be mounted at the flex connection as described with reference to FIG. 2A.

Some advantages of the embodiments of the construction process described herein may include, but are not limited to, simultaneous manufacture/assembly of an array of COF OSAs, the ability to concurrently and/or simultaneously burn-in and/or otherwise test the COF OSAs, or the like or any combination thereof. Alternately or additionally, some embodiments described herein may dispense quick cure tack and/or structural adhesive in a single step for securing separate parts together.

Figure 11:
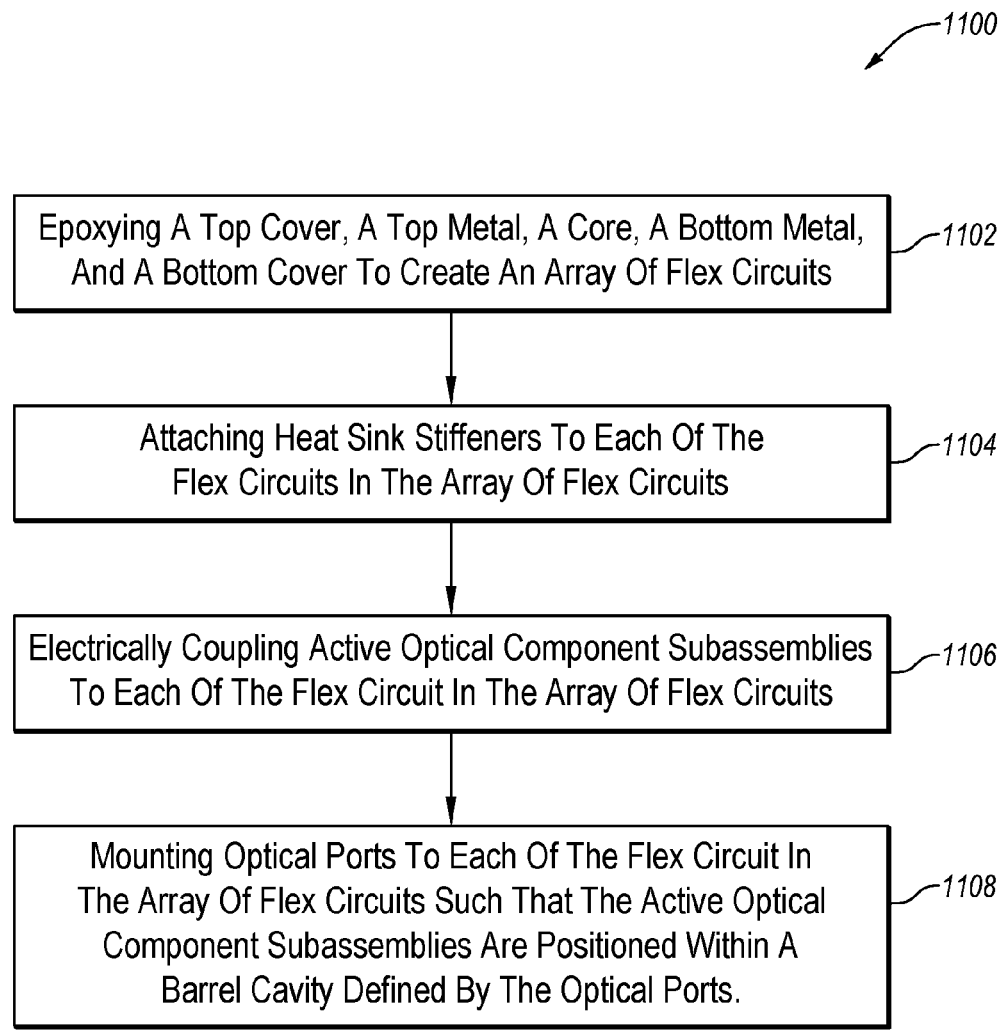
FIG. 11 is a flow chart of an example method of constructing an array of chip on flex optical subassemblies, arranged in accordance with at least some embodiments described herein.

FIG. 11 is a flow chart of an example method 1100 of constructing an array of chip on flex optical subassemblies, arranged in accordance with at least some embodiments described herein. The method 1100 may begin at 1102 by epoxying a top cover, a top metal, a core, a bottom metal, and a bottom cover to create an array of flex circuits.

At 1104, heat sink stiffeners may be attached to each of the flex circuits in the array of flex circuits. At 1106, active optical components subassemblies may be electrically coupled to each of the flex circuits in the array of flex circuits.

At 1108 optical ports may be mounted to each of the flex circuits in the array of flex circuits such that the active optical component subassemblies are positioned within a barrel cavity defined by the optical ports.

One skilled in the art will appreciate that, for this and other procedures and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the disclosed embodiments. For instances, the method 1100 may further include simultaneously conducting a burn-in procedure on the array of chip on flex optical subassemblies.

Additionally or alternatively, the method 1100 may include epoxying a perimeter-mounting structure configured to support borders of the top cover, the top metal, the core, the bottom metal, and the bottom cover during construction of the array of chip on flex optical subassemblies. Additionally or alternatively, the method 1100 may include mechanically coupling the active optical component subassemblies to each of the flex circuit in the array of flex circuits or to each of the heat sink stiffeners. Additionally or alternatively, the method 1100 may include cutting individual chip on flex optical subassemblies from the array of chip on flex optical subassemblies.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical subassembly comprising:
    a flex circuit that includes a printed circuit board (PCB) flex connection and a flex connection, wherein the PCB flex connection is included on a first portion of the flex circuit that is opposite a second portion of the flex circuit that includes the flex connection;
    an optical port that defines a fiber receiver and a barrel cavity, the optical port being mechanically coupled to the flex circuit at the flex connection on a first surface of the flex circuit;
    an active optical subassembly positioned within the barrel cavity and located on the first surface of the flex circuit, wherein the active optical subassembly includes at least one active optical component that is mechanically coupled directly to the flex circuit and is aligned relative to the fiber receiver; and
    a heat sink stiffener located on a second surface of the flex circuit opposite the active optical component subassembly and located on the second portion of the flex circuit, the heat sink stiffener being configured to stiffen the second portion of the flex circuit and act as a thermal sink for at least a portion of heat generated during operation of the active optical subassembly,
    wherein the first portion including the PCB flex connection is unsupported by the heat sink stiffener and is configured to communicate electrical signals between a host system and the active optical subassembly.

2. The optical subassembly of claim 1, wherein the active optical subassembly further includes:
    an optical transmitter configured for conversion of electrical signals to optical signals; and
    a monitor photodiode,
    wherein the optical transmitter and the monitor photodiode are positioned entirely within the barrel cavity.

3. The optical subassembly of claim 2, wherein:
    the active optical subassembly further includes a spacer/heat spreader;

the spacer/heat spreader is positioned between the optical transmitter and the flex circuit or is positioned between the optical transmitter and the heat sink stiffener;

the spacer/heat spreader is electrically coupled to the flex circuit; and the spacer/heat spreader is configured to transfer thermal energy generated during operation of the optical transmitter to the heat sink stiffener.

4. The optical subassembly of claim 3, wherein:

the barrel cavity houses a plate through which an optical signal passes, and the plate is fixed to the optical port and positioned between the active optical component and the fiber receiver.

5. The optical subassembly of claim 1, wherein the active optical component subassembly includes:

an amplifier that is directly mechanically coupled to the flex circuit; and an optical receiver that is positioned on the amplifier and aligned with the fiber receiver.

6. The optical subassembly of claim 5, wherein the optical receiver includes a PIN photodiode or an avalanche photodiode ("APD").

7. The optical subassembly of claim 1, wherein the flex connection includes an electrically insulating connection between the optical port and the flex circuit to prohibit transfer of electrical signals between the optical port and the flex circuit and that aids in suppressing electromagnetic radiation ("EMR") that results from operation of the an active optical subassembly.

8. The optical subassembly of claim 1, wherein the optical port includes a plurality of side faces that are perpendicular to the flex circuit.

9. An optical subassembly comprising:

a flex circuit constructed of at least one electrically-conductive layer and at least one electrical insulator layer, wherein the flex circuit includes a printed circuit board (PCB) flex connection and a flex connection, and the PCB flex connection is included on a first portion of the flex circuit that is opposite a second portion of the flex circuit that includes the flex connection;

an optical port defining a barrel cavity and a fiber receiver configured to receive an optical fiber, wherein the optical port is mechanically coupled to the flex circuit at the flex connection on a first surface of the flex circuit;

an active optical component subassembly that is positioned within the barrel cavity and that includes at least one active optical component that is mechanically coupled directly to an optical component subassembly connection region of the flex circuit; and a heat sink stiffener located on a second surface of the flex circuit opposite the active optical component subassembly and located on the second portion of the flex circuit, the heat sink stiffener being configured to stiffen a second portion of the flex circuit and being configured to act as a thermal sink for at least a portion of heat generated during operation of the active optical subassembly, wherein the PCB flex connection is unsupported by the heat sink stiffener and is configured to communicate electrical signals between a host system and the active optical subassembly.

10. The optical subassembly of claim 9, wherein the flex circuit comprises:

a top cover on which the optical port is mechanically coupled, the top cover including an insulator layer;

a core that is another insulator layer;

a bottom cover to which the heat sink stiffener is mechanically coupled;

a top conductive element that is positioned between the top cover and the core; and a bottom metal conductive layer that is positioned between the core and the bottom cover.

11. The optical subassembly of claim 9, wherein the active optical component subassembly includes:

an amplifier that is directly mechanically coupled to the flex circuit; and an optical receiver that is positioned on the amplifier and aligned with the fiber receiver.

12. The optical subassembly of claim 11, wherein the optical receiver includes a PIN photodiode or an avalanche photodiode ("APD").

13. The optical subassembly of claim 9, wherein the active optical subassembly includes:

an optical transmitter that is aligned with the fiber receiver; and a spacer/heat spreader that is directly electrically coupled to the flex circuit and mechanically attached to one of the flex circuit or the heat sink stiffener, the spacer/heat spreader is configured to dissipate at least a portion of thermal energy generated during operation of the optical transmitter to the heat sink stiffener.

14. The optical subassembly of claim 13, wherein:

the flex circuit defines at least one opening; and the spacer/heat spreader directly contacts the heat sink stiffener such that thermal energy is transferred without moving through the flex circuit.

15. The optical subassembly of claim 13, wherein the spacer/heat spreader includes a film resistive element configured for raising and lowering temperature of one or more components of the active optical subassembly.

16. An optical subassembly comprising:

a flex circuit constructed of at least one electrically-conductive layer and at least one electrical insulator layer, wherein the flex circuit includes a printed circuit board (PCB) flex connection and a flex connection, and the PCB flex connection is included on a first portion of the flex circuit that is opposite a second portion of the flex circuit that includes the flex connection;

an optical port defining a barrel cavity and a fiber receiver configured to receive an optical fiber, the optical port being mechanically coupled to the flex circuit at the flex connection;

an active optical component subassembly that is positioned within the barrel cavity, wherein the active optical component subassembly includes:

a spacer/heat spreader that is directly electrically coupled to a connection region of the flex circuit;

a monitor photodiode ("PD") that is directly electrically coupled to the connection region and is affixed to a top surface of the spacer/heat spreader; and an optical transmitter affixed to the top surface of the spacer/heat spreader and directly electrically coupled to the connection region; and a heat sink stiffener located on a second surface of the flex circuit opposite the active optical component subassembly and located on the second portion of the flex circuit, wherein the heat sink stiffener is configured to stiffen the second portion of the flex circuit and act as a thermal sink for heat generated during operation of the optical transmitter, wherein the PCB flex connection is unsupported by the heat sink stiffener and is configured to communicate electrical signals between a host system and the active optical subassembly.

17. The optical subassembly of claim 16, further comprising a plate fixed to the optical port and positioned within the barrel cavity between the optical transmitter and the fiber receiver.

18. The optical subassembly of claim 17, wherein the plate is configured to allow optical signals transmitted by the optical transmitter to pass through an first surface of the plate and subsequently through an opposing second surface of the plate.

19. The optical subassembly of claim 16, wherein the fiber receiver is oriented perpendicular to the flex connection of the flex circuit.

* * * * *